(12) United States Patent
Kim et al.

(10) Patent No.: US 11,283,270 B2
(45) Date of Patent: Mar. 22, 2022

(54) ELECTRONIC DEVICE AND METHOD FOR MANAGING BATTERY THEREOF

(71) Applicant: Samsung Electronics Co., Ltd., Gyeonggi-do (KR)

(72) Inventors: Duhyun Kim, Gyeonggi-do (KR); Seungbeom Kang, Gyeonggi-do (KR); Wooin Choi, Gyeonggi-do (KR); Jungsik Park, Gyeonggi-do (KR); Seunghui Sunwoo, Gyeonggi-do (KR); Hyoungseok Oh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 264 days.

(21) Appl. No.: 16/512,610

(22) Filed: Jul. 16, 2019

(65) Prior Publication Data

US 2020/0036198 A1    Jan. 30, 2020

(30) Foreign Application Priority Data

Jul. 26, 2018    (KR) .................. 10-2018-0086953

(51) Int. Cl.
*G06F 9/455* (2018.01)
*G06F 7/50* (2006.01)
(Continued)

(52) U.S. Cl.
CPC ...... *H02J 7/0021* (2013.01); *H02J 7/007184* (2020.01); *H05K 1/189* (2013.01);
(Continued)

(58) Field of Classification Search
USPC ........ 320/106, 107, 108, 134, 136, 137, 138
See application file for complete search history.

(56) References Cited

U.S. PATENT DOCUMENTS 9,710,033 B2    7/2017    Yamazaki et al.
10,139,879 B2    11/2018    Yamazaki et al.
(Continued)

FOREIGN PATENT DOCUMENTS

EP    1921727 A2    5/2008
JP    2002-325375 A    11/2002
(Continued)

OTHER PUBLICATIONS

European Search Report dated Mar. 24, 2020.
International Search Report dated Nov. 11, 2019.

*Primary Examiner* — Brian Ngo
(74) *Attorney, Agent, or Firm* — Cha & Reiter, LLC.

(57) ABSTRACT

An electronic device is disclosed. The electronic device may include a housing having a first housing structure and a second housing structure, wherein the first and second housing structures are foldable with respect to each other about a hinge axis, a processor disposed in the housing, a first battery disposed in the first housing structure, a second battery disposed in the second housing, a flexible printed circuit board (FPCB) extending from the first housing structure to the second housing structure and crossing the hinge axis, a power management integrated circuit (PMIC), a first charging control circuit disposed in the first housing structure, and a second charging control circuit disposed in the second housing structure. In addition, various embodiments are possible which are understood through the disclosure.

20 Claims, 12 Drawing Sheets

(51) Int. Cl.
*H02J 7/00* (2006.01)
*H05K 5/00* (2006.01)
*H05K 1/18* (2006.01)
*H05K 5/02* (2006.01)

(52) U.S. Cl.
CPC ......... *H05K 5/0004* (2013.01); *H05K 5/0086* (2013.01); *H05K 5/0226* (2013.01); *H05K 5/0017* (2013.01)

(56) References Cited

U.S. PATENT DOCUMENTS

| | | |
|---|---|---|
| 10,203,736 B2 | 2/2019 | Lam et al. |
| 2008/0106234 A1 | 5/2008 | Yun |
| 2010/0134305 A1 | 6/2010 | Lu et al. |
| 2011/0241620 A1 | 10/2011 | Lin et al. |
| 2013/0083468 A1* | 4/2013 | Becze .................. G06F 3/00 361/679.27 |
| 2014/0268556 A1 | 9/2014 | Lam et al. |
| 2015/0248149 A1 | 9/2015 | Yamazaki et al. |
| 2016/0301150 A1* | 10/2016 | Choi .................... H05K 1/148 |
| 2017/0019511 A1* | 1/2017 | Yang .................... H04B 1/3888 |
| 2017/0228002 A1* | 8/2017 | Yamazaki ............ G06F 3/0446 |
| 2019/0006722 A1* | 1/2019 | Kim ..................... H02J 7/0026 |
| 2019/0107876 A1 | 4/2019 | Yamazaki et al. |
| 2019/0189042 A1* | 6/2019 | Aurongzeb ........... G06F 1/1637 |
| 2019/0369668 A1* | 12/2019 | Kim .................... H01L 51/5237 |
| 2019/0387084 A1 | 12/2019 | Lee et al. |
| 2020/0036198 A1* | 1/2020 | Kim ..................... H05K 1/189 |

FOREIGN PATENT DOCUMENTS

| | | |
|---|---|---|
| KR | 10-0125141 B1 | 12/1997 |
| KR | 10-1388388 B1 | 4/2014 |
| KR | 10-2017-0027871 A | 3/2017 |
| KR | 10-2018-0066762 A | 6/2018 |
| KR | 10-2019-0001830 A | 1/2019 |
| WO | 2018/062585 A1 | 4/2018 |

* cited by examiner

ELECTRONIC DEVICE AND METHOD FOR MANAGING BATTERY THEREOF

CROSS-REFERENCE TO RELATED APPLICATION(S)

This application is based on and claims priority under 35 U.S.C. § 119 to Korean Patent Application No. 10-2018-0086953, filed on Jul. 26, 2018, in the Korean Intellectual Property Office, the disclosure of which is incorporated by reference herein its entirety.

BACKGROUND

1. Field

The present disclosure generally relates to methods for managing a battery of an electronic device.

2. Description of Related Art

There may be provided a portable electronic device (foldable electronic device) to which a hinge structure is applied. The foldable electronic device may be implemented to have one battery on one side of the hinge structure and a display that is foldable according to the movement of the hinge structure.

For high-performing portable electronic devices, these electronic devices have been increasingly designed to be small, slim, have high-capacity batteries, and have large screens, such that the display for example occupies a substantial portion of the front surface of the device.

The above information is presented as background information only to assist with an understanding of the disclosure. No determination has been made, and no assertion is made, as to whether any of the above might be applicable as prior art with regard to the disclosure.

SUMMARY

However, because as the capacity of the battery becomes larger, the size or thickness of the battery also becomes larger. And in cases when the display occupies a substantial portion of the front surface of the foldable electronic device, the battery may be disposed on only one side of the hinge structure. This these cases, overall thickness of the electronic device may become large.

In order to prevent this, the foldable electronic device may have batteries respectively on both sides of the hinge structure, and the plurality of batteries may be connected in series or in parallel using a connecting member.

However, when the plurality of batteries in the electronic device are connected in series in this fashion, the boosted output of the plurality of batteries boosted by the series connection may be lowered. Accordingly, the driving power outputted from the batteries may be lowered. Therefore, power loss may occur in the output decompressing process.

On the other hand, when the plurality of batteries in the electronic device are connected in parallel, there may be a difference in impedances of the batteries loaded on a power management integrated circuit due to the length of the connecting member connecting the plurality of batteries. The power management integrated circuit governs charging of the batteries based on an overall state of the batteries, therefore, charging current may not be uniformly distributed to the batteries due to the impedance difference. The power management integrated circuit continues to charge the battery until all of the batteries are fully charged, therefore overcharging may occur on the battery among the plurality of batteries that first becomes fully charged. This overcharging may lead to battery damage. Conversely, over-discharging may occur on some of the plurality of batteries during the battery discharging process. The over-discharging of the battery may cause battery damage or unpredictable power-off of the electronic device.

Aspects of the disclosure are to address at least the above-mentioned problems and/or disadvantages and to provide at least the advantages described below. Accordingly, an aspect of the disclosure is to provide an electronic device capable of controlling charging/discharging of a plurality of batteries connected in parallel and a method for managing one or more batteries.

In accordance with an aspect of the disclosure, an electronic device may include a housing that has a first housing structure and a second housing structure, wherein the first and second housing structures are foldable with respect to each other about a hinge axis, a processor disposed in the housing, a first battery disposed in the first housing structure, a second battery disposed in the second housing, a flexible printed circuit board (FPCB) extending from the first housing structure to the second housing structure and crossing the hinge axis, a power management integrated circuit (PMIC) disposed in the first housing structure and electrically connected to the processor and the FPCB, a first charging control circuit disposed in the first housing structure and electrically connected to the power management integrated circuit, the processor, the first battery, and the FPCB; and a second charging control circuit disposed in the second housing structure and electrically connected to the power management integrated circuit, the processor, the second battery, and the FPCB.

In accordance with another aspect of the disclosure, a foldable electronic device may include a first bracket, a second bracket, a hinge structure constructed to adjust an angle between the first bracket and the second bracket, a first battery disposed on one side of the first bracket, a second battery disposed on one side of the second bracket, a connecting member including a portion disposed between the first bracket and the second bracket, wherein connecting the member connects the first battery and the second battery in parallel, a first charging control circuit disposed on one side of the first bracket for limiting input or output current into or from the first battery, a second charging control circuit disposed on one side of the second bracket for limiting input or output current into or from the second battery, and a processor operatively connected to the first battery, the second battery, the first charging control circuit, and the second charging control circuit. The processor may identify an operation state of the foldable electronic device when the operation state is a first operation state, control the first charging control circuit to limit a charging current of the first battery to be in a first specified range, and control the second charging control circuit to limit a charging current of the second battery to be in a second specified range, when the operation state is a second operation state, control the first charging control circuit to limit a discharging current of the first battery to be in a third specified range, and control the second charging control circuit to limit a discharging current of the second battery to be in a fourth specified range, and when the operation state is a third operation state, control the second charging control circuit to interrupt flow of the discharging current of the second battery.

In accordance with another aspect of the disclosure, a method for managing a battery by an electronic device may include identifying an operation state of the electronic device, when the operation state is a first operation state, controlling the first charging control circuit to limit a charging current of the first battery to be in a first specified range, and controlling the second charging control circuit to limit a charging current of the second battery to be in a second specified range, when the operation state is a second operation state, controlling the first charging control circuit to limit a discharging current of the first battery to be in a third specified range, and controlling the second charging control circuit to limit a discharging current of the second battery to be in a fourth specified range, and when the operation state is a third operation state, controlling the second charging control circuit to interrupt flow of the discharging current of the second battery.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
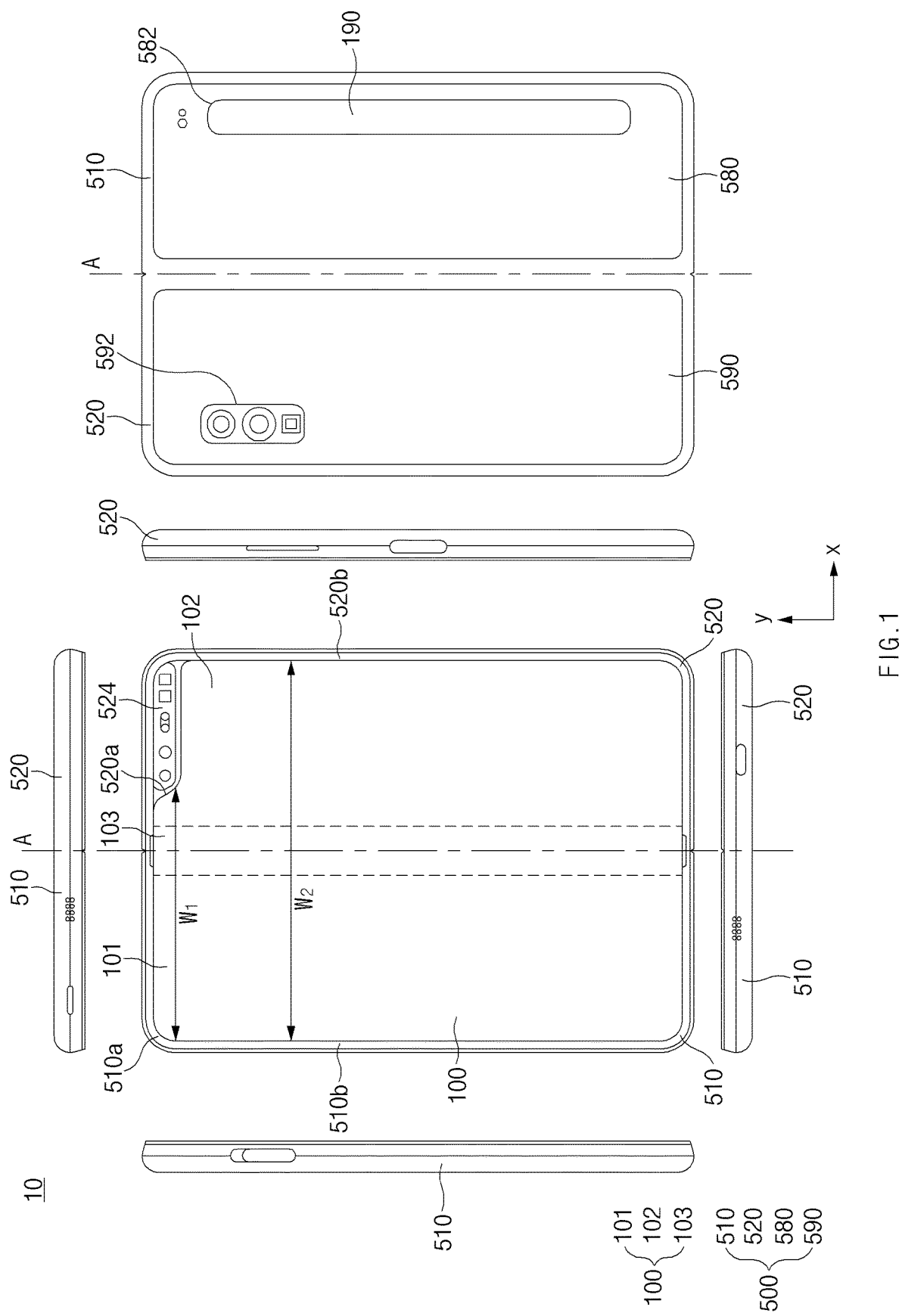
FIG. 1 are front, back, side, top, and bottom views of an electronic device in an unfolded state according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

In the disclosure, the expressions "have," "may have," "include," "comprise," "may include," and "may comprise" used herein indicate existence of corresponding features (e.g., components such as numeric values, functions, operations, or parts) but do not exclude presence of additional features.

In the disclosure, the expressions "A or B," "at least one of A or/and B," or "one or more of A or/and B," and the like may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when a component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for," "having the capacity to," "designed to," "adapted to," "made to," or "capable of" The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automated teller machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of the disclosure may not be limited to the above-described electronic devices and may include other electronic devices and new electronic devices according to the development of technologies.

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

Figure 2:
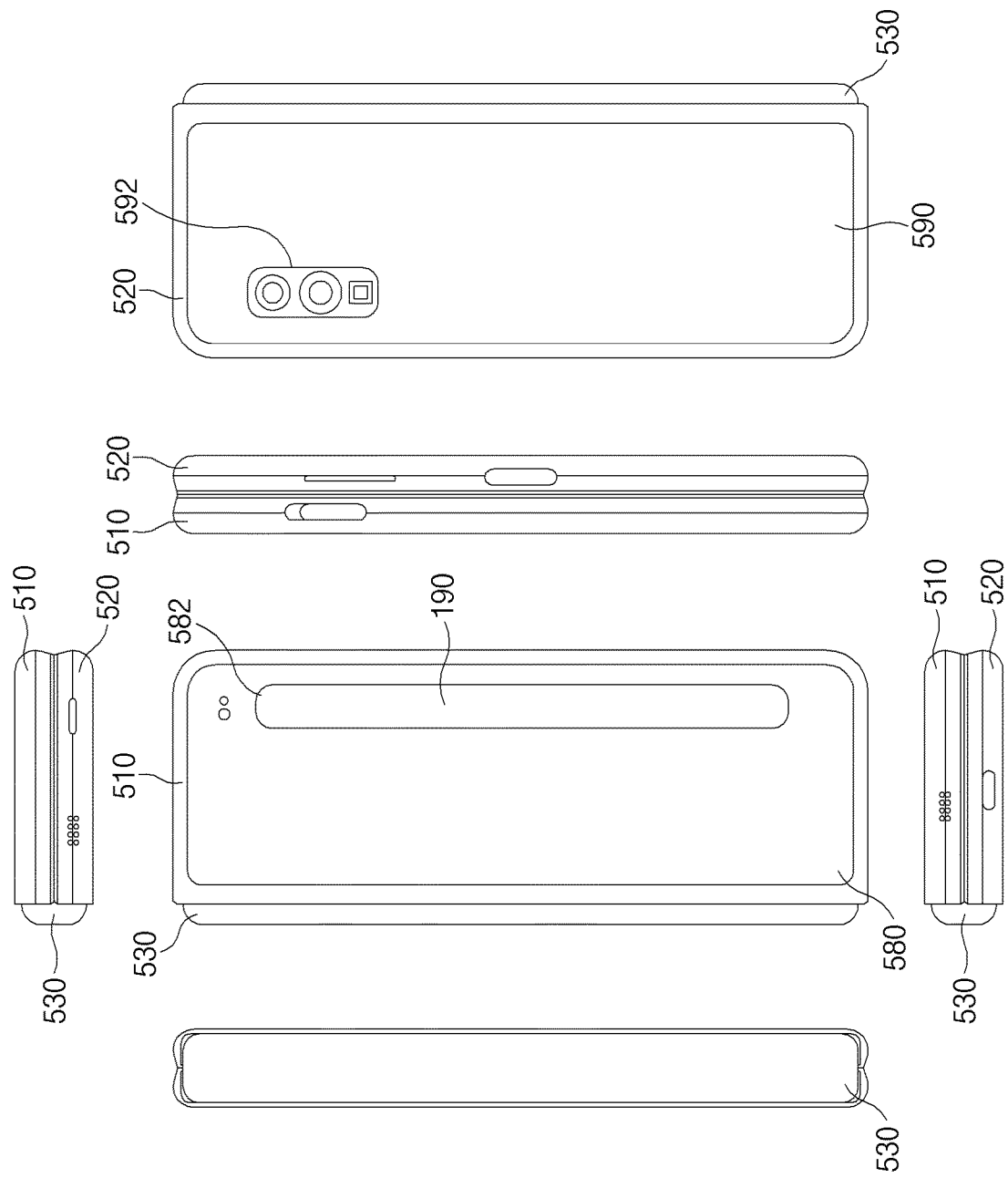
FIG. 2 are front, back, side, top, and bottom views of an electronic device in a folded state according to an embodiment.

FIG. 1 are front, back, side, top, and bottom views of an electronic device in an unfolded state according to an embodiment. Further, FIG. 2 are front, back, side, top, and bottom views of an electronic device in a folded state according to an embodiment. In one embodiment, an electronic device 10 may be in the flat state or the unfolded state illustrated in FIG. 1, the folded state illustrated in FIG. 2, or an intermediate state between the flat state and the folded state. In the disclosure, "folded state" means "a fully folded state" unless otherwise defined.

Referring to FIG. 1 and FIG. 2, in one embodiment, the electronic device 10 may include a foldable housing 500, a hinge-cover 530 for covering a foldable portion of the foldable housing, and a flexible or foldable display 100 (hereinafter, abbreviated as "display" 100) disposed on a space defined by the foldable housing 500. In the disclosure, the surface on which the display 100 is disposed is defined as the first surface or the front surface of the electronic device 10. In addition, the surface opposite to the front surface is defined as the second surface or the rear surface of the electronic device 10. Further, the surface surrounding a space between the front surface and the rear surface is defined as the third surface or the side surface of the electronic device 10.

In one embodiment, the foldable housing 500 may include a first housing structure 510, a second housing structure 520 including a sensor region 524, a first rear surface cover 580, and a second rear surface cover 590. The foldable housing 500 of the electronic device 10 is not limited to shapes and couplings illustrated in FIG. 1 and FIG. 2 and may be implemented in other shapes or by other combinations and/or couplings of components. For example, in another embodiment, the first housing structure 510 and the first rear surface cover 580 may be integrally formed, and the second housing structure 520 and the second rear surface cover 590 may be integrally formed.

In an illustrated embodiment, the first housing structure 510 and the second housing structure 520 may be disposed on both sides around a folding axis (A-axis), respectively, and may have generally symmetrical shapes with respect to the folding axis A. As will be described below, the angle or the distance between the first housing structure 510 and the second housing structure 520 may be different depending on whether the electronic device 10 is in the flat state, folded state, or intermediate state. In an illustrated embodiment, the second housing structure 520 may further include the sensor region 524 in which various sensors are disposed, which may be different from the first housing structure 510. However, in other respects, the second housing structure 520 may have a shape symmetrical to the shape of the first housing structure 510.

In one embodiment, as shown in FIG. 1, the first housing structure 510 and the second housing structure 520 may define a recess for receiving the display 100 together. In the illustrated embodiment, as indicated by $W_1$ and $W_2$, due to the sensor region 524, the recess may have two or more different widths in the direction perpendicular to the folding axis A.

For example, the recess may have (1) a first width w1 between a first portion 510a, which is parallel to the folding axis A, of the first housing structure 510 and a first portion 520a, which is formed at an edge of the sensor region 524, of the second housing structure 520 and (2) a second width w2 between a second portion 510b of the first housing structure 510 and a second portion 520b of the second housing structure 520, which is parallel to the folding axis A but does not correspond to the sensor region 524. In this case, the second width w2 may be larger than the first width w1. In other words, the first portion 510*a* of the first housing structure 510 and the first portion 520*a* of the second housing structure 520 having mutually asymmetric shapes defining the first width w1 of the recess. In addition, the second portion 510*b* of the first housing structure 510 and the second portion 520*b* of the second housing structure 520 having mutually symmetric shapes defining the second width w2 of the recess. Thus, in this embodiment, the first portion 520*a* and the second portion 520*b* of the second housing structure 520 may have different distances from the folding axis A. The width of the recess is not limited to the illustrated example. In various other embodiments, the recess may have plurality of widths due to the shape of the sensor region 524 or due to the presence of asymmetrically shaped portions of the first housing structure 510 and second housing structure 520.

In one embodiment, at least a portion of the first housing structure 510 and the second housing structure 520 may be formed of metallic or non-metallic materials having selected degrees of rigidity for supporting the display 100.

In one embodiment, the sensor region 524 may be formed to have a predetermined region adjacent one corner of the second housing structure 520. However, arrangement, shape, and size of the sensor region 524 are not limited to the illustrated examples. For example, in another embodiment, the sensor region 524 may be provided at another corner of the second housing structure 520 or in any region along a side of the second housing structure 520. In one embodiment, components for performing various built-in functions of the electronic device 10 may be exposed through the front surface of the electronic device 10 via the sensor region 524 or via one or more openings provided in the sensor region 524. In various different embodiments, the components may include various types of sensors. The sensor may include, for example, at least one of a front surface camera, a receiver, or a proximity sensor.

The first rear surface cover 580 may be disposed on one side of the folding axis on the rear surface of the electronic device. The first rear surface cover 580 may have, for example, a substantially rectangular shape, and the periphery of the rear surface cover 580 may be enclosed by the first housing structure 510. Similarly, the second rear surface cover 590 may be disposed on the other side of the folding axis on the rear surface of the electronic device, and a periphery thereof may be enclosed by the second housing structure 520.

In the illustrated embodiment, the first rear surface cover 580 and the second rear surface cover 590 may have substantially symmetrical shapes around the folding axis (A-axis). However, the first rear surface cover 580 and the second rear surface cover 590 do not necessarily have to have mutually symmetrical shapes. In another embodiment, the electronic device 10 may include the first rear surface cover 580 and second rear surface cover 590 of various shapes. In another embodiment, the first rear surface cover 580 may be integrally formed with the first housing structure 510, and the second rear surface cover 590 may be integrally formed with the second housing structure 520.

In one embodiment, the first rear surface cover 580, the second rear surface cover 590, the first housing structure 510, and the second housing structure 520 may define a space in which various components (e.g., printed circuit board, a battery, processor, etc.) of the electronic device 10 may be disposed. In one embodiment, at least one component may be arranged on or exposed through the rear surface of the electronic device 10. For example, at least a portion of a sub display 190 may be visually exposed through a rear surface region 582 of the first rear surface cover 580. In another embodiment, at least one component or sensor may be visually exposed through a second rear surface region 592 of the second rear surface cover 590. In one embodiment, the sensors exposed through the second rear surface region may include a proximity sensor and/or a rear surface camera.

Referring to FIG. 2, the hinge-cover 530 may be disposed between the first housing structure 510 and the second housing structure 520 to cover internal components (e.g., the hinge structure). In one embodiment, the hinge-cover 530 may be obscured by a portion of the first housing structure 510 and the second housing structure 520 or exposed to outside depending on the folding state (i.e. the flat state or the folded state) of the electronic device 10.

In one example, as shown in FIG. 1, when the electronic device 10 is in the flat state, the hinge-cover 530 may be obscured by the first housing structure 510 and the second housing structure 520 and may not be exposed. But in another example, as shown in FIG. 2, when the electronic device 10 is in the folded state (e.g., the fully folded state), the hinge-cover 530 may be exposed between the first housing structure 510 and the second housing structure 520. In still another example, when the first housing structure 510 and the second housing structure 520 are in the intermediate state in which the first and second housing structures 510 and 520 are folded with at a certain angle (i.e. at an angle less than 180 degrees), the hinge-cover 530 may be partially exposed between the first housing structure 510 and the second housing structure 520. In this case, however, the exposed region of the hinge-cover 530 may be smaller than that in the fully folded state. In one embodiment, the hinge-cover 530 may include a curved surface.

The display 100 may be disposed on the space defined by the foldable housing 500. For example, the display 100 may be seated on the recess defined by the foldable housing 500 and may constitute a substantial portion of the front surface of the electronic device 10.

Thus, the front surface of the electronic device 10 may include the display 100, a portion of the first housing structure 510 adjacent to the display 100, and a portion of the second housing structure 520 adjacent to the display 100. Further, the rear surface of the electronic device 10 may include the first rear surface cover 580, a portion of the first housing structure 510 adjacent to the first rear surface cover 580, the second rear surface cover 590, and a portion of the second housing structure 520 adjacent to the second rear surface cover 590.

The display 100 may refer to a display in which at least a portion thereof may be foldable into a plane or a curved surface. In one embodiment, the display 100 may include a foldable region 103, a first region 101 disposed on one side of the foldable region 103 (the left side of the foldable region 103 shown in FIG. 1), and a second region 102 disposed the other side of the foldable region 103 (the right side of the foldable region 103 shown in FIG. 1). According to another embodiment, another display may be a planar display (i.e. non-foldable display). In this case, the display may have a size corresponding to the first region 101, and may be disposed on the first region 101. An input device (not shown) such as a keypad and the like may be disposed on the second region 102. In this example, the electronic device 10 may be configured such that, in the folded state, the display is disposed on one internal surface and the input device is disposed on another internal surface, similar to a laptop computer.

Region division of the display 100 shown in FIG. 1 is exemplary. The display 100 may be divided into a plurality of regions (e.g., four or more or two) depending on structure or function. In one example, in the embodiment shown in FIG. 1, the regions of the display 100 may be divided by the foldable region 103 extending parallel to the y-axis or the folding axis (A-axis). However, in another embodiment, the regions of the display 100 may be divided by another foldable region (e.g., a foldable region parallel to the x-axis), as in the case when the folding axis is parallel to the x-axis.

The first region 101 and the second region 102 may have generally symmetrical shapes around the foldable region 103. However, the second region 102 may include a notch cut based on the presence of the sensor region 524, unlike the first region 101. But other than the notch, the second region 102 may have a shape symmetric to the first region 101. In other words, the first region 101 and the second region 102 may include portions having shapes symmetric to each other and portions having shapes asymmetric to each other.

Hereinafter, operations of the first housing structure 510 and the second housing structure 520 and the respective regions of the display 100 based on a state (e.g. the flat state and the folded state) of the electronic device 10 will be described.

In one embodiment, when the electronic device 10 is in the flat state (e.g., FIG. 1), the first housing structure 510 and the second housing structure 520 may be arranged to face the same direction at an angle of 180 degrees. A surface of the first region 101 and a surface of the second region 102 of the display 100 may form an angle of 180 degrees with each other, and may face the same direction (e.g., the front of the electronic device). The foldable region 103 may be coplanar with the first region 101 and the second region 102.

In one embodiment, when the electronic device 10 is in the folded state (e.g., FIG. 2), the first housing structure 510 and the second housing structure 520 may be disposed to face each other. The surface of the first region 101 and the surface of the second region 102 of the display 100 may form a narrow angle (e.g., from 0 to 10 degrees), and may face each other. In this state, the foldable region 103 may be in the shape of a curved surface at least partially having a predetermined curvature.

In one embodiment, when the electronic device 10 is in the intermediate folded state, the first housing structure 510 and the second housing structure 520 may be disposed to form a certain angle with each other. The surface of the first region 101 and the surface of the second region 102 of the display 100 may form an angle larger than that in the folded state but smaller than that in the flat state. The foldable region 103 may be in the shape of a curved surface at least partially having a predetermined curvature. In this case, the curvature may be smaller than that in the fully folded state.

Figure 3:
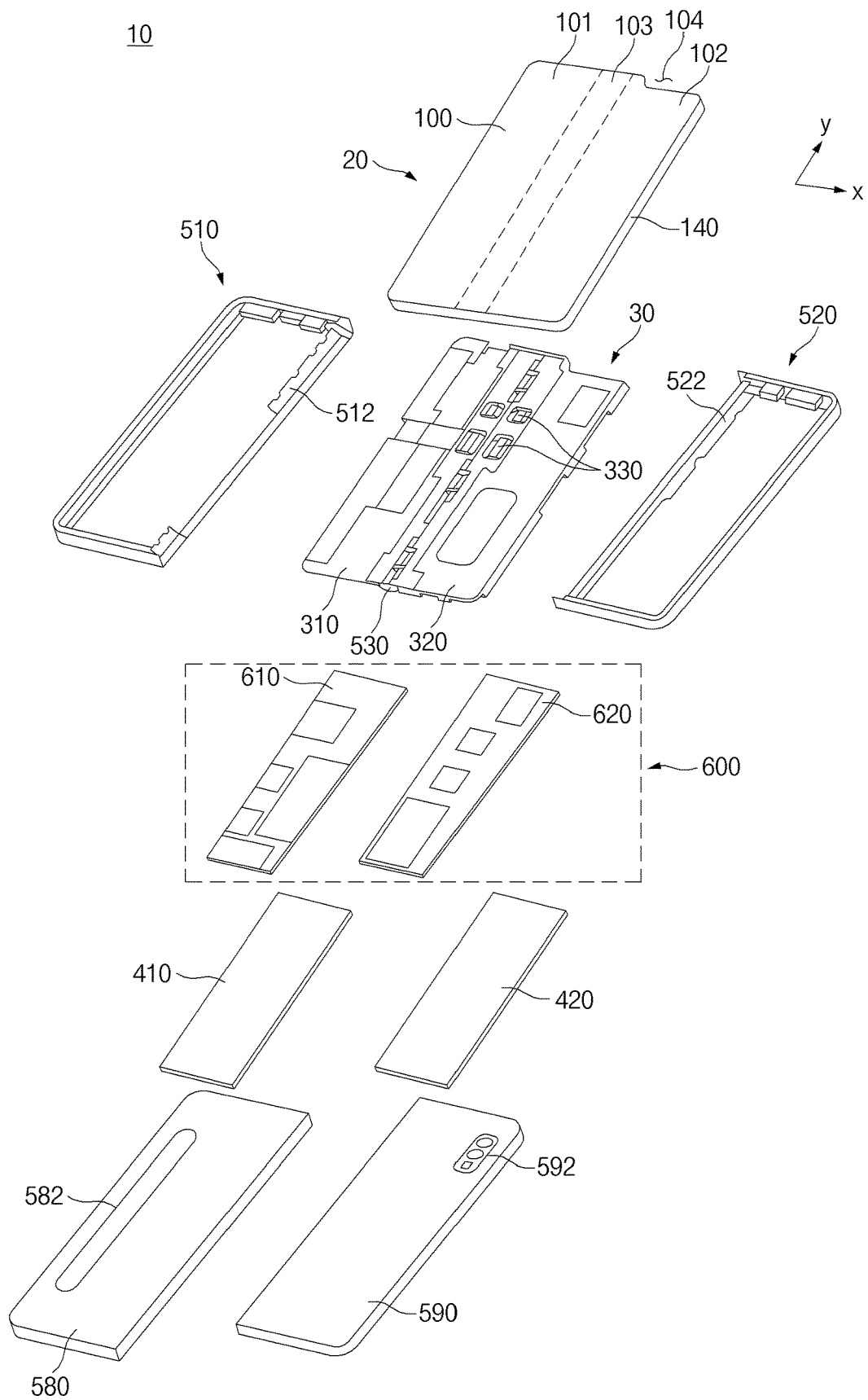
FIG. 3 is an exploded perspective view of an electronic device according to an embodiment.

FIG. 3 is an exploded perspective view of an electronic device according to an embodiment.

Referring to FIG. 3, in one embodiment, the electronic device 10 may include a display unit 20, a bracket assembly 30, a substrate unit 600, the first housing structure 510, the second housing structure 520, the first rear surface cover 580, and the second rear surface cover 590. In the disclosure, the display unit 20 may be referred to as a display module or a display assembly.

The display unit 20 may include the display 100 and at least one plate or layer 140 on which the display 100 is seated. In one embodiment, the plate 140 may be disposed between the display 100 and the bracket assembly 30. The display 100 may be disposed on at least a portion of one face (top surface with respect to FIG. 3) of the plate 140. The plate 140 may be formed in a shape corresponding to the display 100. Thus, for example, a portion of the plate 140 may be formed in a shape corresponding to a notch 104 of the display 100.

The bracket assembly 30 may include a first bracket 310, a second bracket 320, the hinge structure disposed between the first bracket 310 and the second bracket 320, the hinge-cover 530 for covering the hinge structure so that it is not exposed to the outside, and a wiring member 330 (e.g., a flexible printed circuit (FPC)) crossing the first bracket 310 and the second bracket 320. The hinge structure is contained within the hinge-cover 530 and at least a portion thereof is fixed to the first bracket 310 and the second bracket 320 such that the angle between the first bracket 310 and the second bracket 320 may be adjusted according to the configuration of the hinge structure (e.g. whether the hinge structure is flat or folded).

In one embodiment, the bracket assembly 30 may be disposed between the plate 140 and the substrate unit 600. In one example, the first bracket 310 may be disposed between the first region 101 of the display 100 and a first substrate 610. The second bracket 320 may be disposed between the second region 102 of the display 100 and a second substrate 620.

In one embodiment, at least a portion of the wiring member 330 and the hinge structure 300 may be disposed inside the bracket assembly 30. The wiring member 330 may be disposed in a direction (e.g., x-axis direction) across the first bracket 310 and the second bracket 320. Thus, the wiring member 330 may be disposed in a direction (e.g., the x-axis) perpendicular to the folding axis of the foldable region 103 (e.g., the y-axis or the folding axis A in FIG. 1) of the electronic device 10.

The substrate unit 600 may include the first substrate 610 disposed on the first bracket 310 side and the second substrate 620 disposed on the second bracket 320 side, as described above. The first substrate 610 and the second substrate 620 may be disposed in a space defined by the bracket assembly 30, the first housing structure 510, the second housing structure 520, the first rear surface cover 580, and the second rear surface cover 590. Components for implementing various functions of the electronic device 10, for example processor and memory, may be mounted on the first substrate 610 and the second substrate 620.

The first housing structure 510 and the second housing structure 520 may be assembled to each other such that the first housing structure 510 and the second housing structure 520 are coupled to both sides of the bracket assembly 30 respectively, when at the same time the display unit 20 is also coupled to the bracket assembly 30. As will be described below, the first housing structure 510 and the second housing structure 520 may be slid on the both sides of the bracket assembly 30 to be coupled to the bracket assembly 30.

In one embodiment, the first housing structure 510 may include a first folding support surface 512 and the second housing structure 520 may include a second folding support surface 522. The first folding support surface 512 and the second folding support surface 522 may respectively include curved surfaces corresponding to the curved surface of the hinge-cover 530.

In one embodiment, when the electronic device 10 is in the flat state (e.g., the electronic device of FIG. 1), the first folding support surface 512 and the second folding support surface 522 may cover the hinge-cover 530 such that the hinge-cover 530 is not exposed or minimally exposed through the rear surface of the electronic device 10. Further, when the electronic device 10 is folded into the folded state (e.g., the electronic device 10 of FIG. 2), the first folding support surface 512 and the second folding support surface 522 may be moved along the curved surface of the hinge-cover 530 such that the hinge-cover 530 is maximally exposed through the rear surface of the electronic device 10.

According to one embodiment, a first battery 410 may be disposed adjacent to a first surface (e.g., a surface facing the front surface of the electronic device 10) or a second surface (e.g., a surface facing the rear surface of the electronic device 10) of the first substrate 610. For example, the first battery 410 may be disposed between the first substrate 610 and the first rear surface cover 580 so that it is adjacent to the second surface of the first substrate 610.

According to one embodiment, a second battery 420 may be disposed adjacent to a first surface (e.g., a surface facing the front surface of the electronic device 10) or a second surface (e.g., a surface facing the rear surface of the electronic device 10) of the second substrate 620. For example, the second battery 420 may be disposed between the second substrate 620 and the second rear surface cover 590 so that it is adjacent to the second surface of the second substrate 620.

Figure 4:
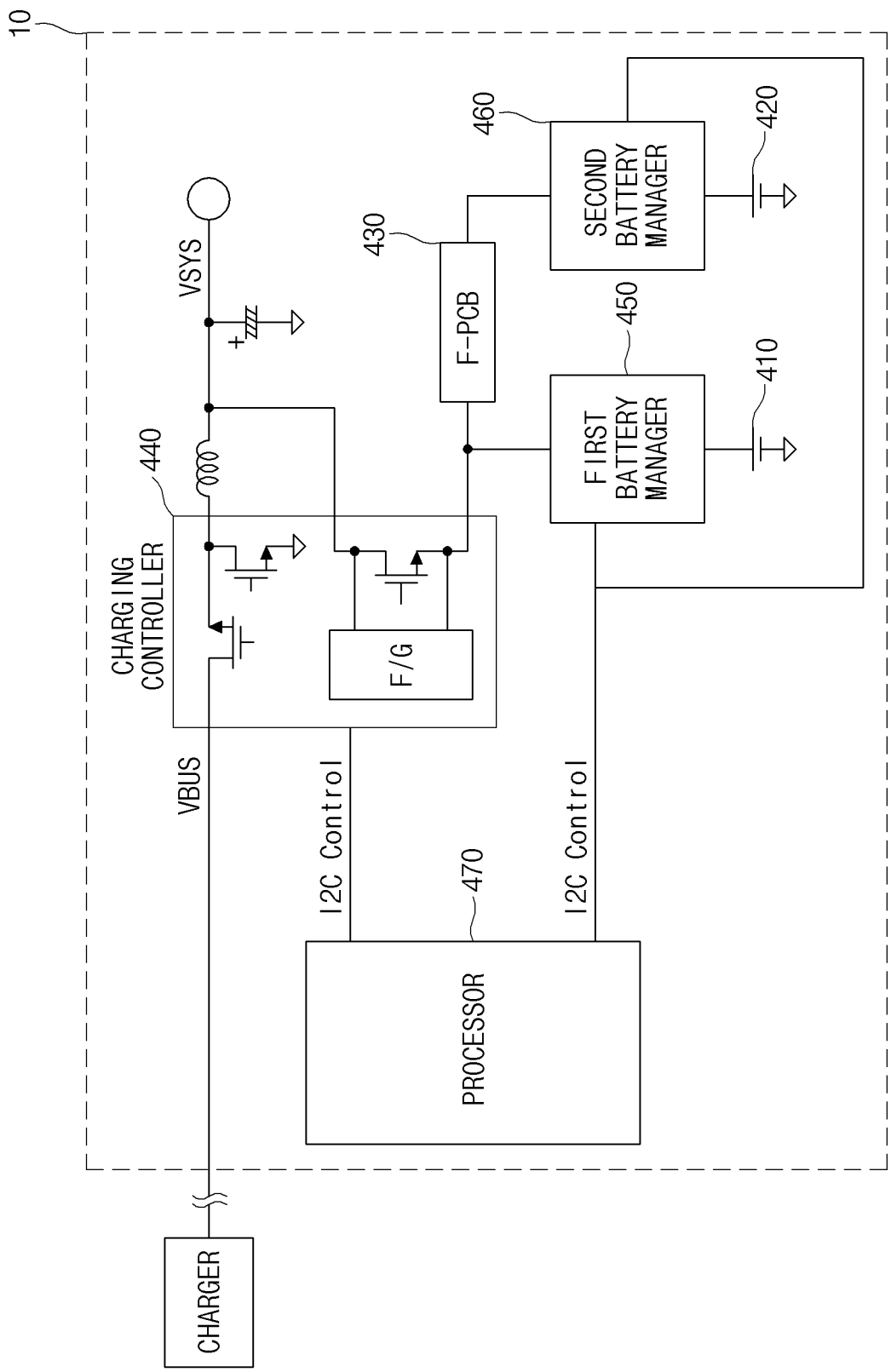
FIG. 4 is a circuit diagram illustrating an electronic device (e.g.: an electronic device 10 of FIG. 1) according to an embodiment.

FIG. 4 is a circuit diagram illustrating an electronic device (e.g.: the electronic device 10 of FIG. 1) according to an embodiment.

Referring to FIG. 4, according to one embodiment, the electronic device 10 may include the first battery 410 (e.g., the first battery 410 of FIG. 3), the second battery 420 (e.g., the second battery 420 of FIG. 3), a connecting member 430, a power management integrated circuit 440, a first charging control circuit 450, a second charging control circuit 460, and a processor 470. In one embodiment, some of the shown components of the electronic device 10 may be omitted, or the electronic device 10 may further include additional components. For example, the electronic device 10 may further include one or more batteries and one or more charging control circuits. In one embodiment, some of the components of the electronic device 10 may be combined into one entity, but functions of the components before the combination may be performed in the same manner. For example, the power management integrated circuit 440 may be included in the processor 470.

According to one embodiment, the first battery 410 may be connected to a power input VSYS of the electronic device 10 via the first charging control circuit 450 and the power management integrated circuit 440. The first battery 410 may be a main battery of a first capacity (e.g., 2000 mAh). The power input VSYS may be a node where power supplied from a power supplier, such as an external charger, the first battery 410, or the second battery 420, flows into a system circuit (e.g., the processor 470) of the electronic device 10 or an output pin of the power management integrated circuit 440.

According to one embodiment, the second battery 420 may be connected to the power input VSYS of the electronic device 10 via the second charging control circuit 460 and the power management integrated circuit 440. The second battery 420 may be a sub battery of a second capacity (e.g., 2000 mAh). The second battery 420 may be switched to be in a no-load state based on a command from the processor 470. The second capacity may be the equal to or different from the first capacity.

According to one embodiment, the connecting member 430 may connect the first battery 410 and the second battery 420 in parallel, having the first charging control circuit 450 and the second charging control circuit 460 therebetween. For example, the connecting member 430 may connect a positive (+) terminal of the first battery 410 and a positive terminal of the second battery 420 in parallel, having the first charging control circuit 450 and the second charging control circuit 460 therebetween. In one embodiment, the connecting member 430 may include a flexible printed circuit board (FPCB), a first connector and a second connector mounted on the flexible circuit board, a third connector mounted on the first substrate 610, and a fourth connector mounted on the second substrate 620. When the first connector is connected to the third connector, and the second connector is connected to the fourth connector, the connecting member 430 may connect the first battery 410 and the second battery 420 in parallel, where the first charging control circuit 450 may be mounted on the first substrate 610 and the second charging control circuit 460 may be mounted on the second substrate 620 therebetween.

According to one embodiment, when the external charger (e.g., a charger including a travel adapter (TA)) is connected to the electronic device 10, the power management integrated circuit 440 may use at least some of the power supplied from the external charger to control charging of the first battery 410 and the second battery 420. For example, the power management integrated circuit 440 may monitor a total voltage (i.e. parallel voltage) of the first battery 410 and the second battery 420 connected in parallel to each other and a total current supplied to the first battery 410 and the second battery 420. The power management integrated circuit 440 may use a switching element (e.g., FET) to control switching based on the total voltage of the first battery 410 and the second battery 420 such that charging current flowing into the first battery 410 and the second battery 420 may be controlled. For example, when the total voltage is higher than a first reference voltage (e.g., 2.5V) and equal to or lower than a second reference voltage (e.g., 3.1V), the power management integrated circuit 440 may supply charging current of 0.5 C to the first and second batteries 410 and 420, where the 0.5 C value is based on the total capacity of the first and second batteries 410 and 420. When the total voltage is higher than the second reference voltage and equal to or lower than a third reference voltage (e.g., 4.1V), the power management integrated circuit 440 may supply charging current of 1 C to the first and second batteries 410 and 420, where the 1 C value is based on the total capacity of the first and second batteries 410 and 420. When the first and second batteries 410 and 420 are charged at 1 C, it may be referred to as the constant current charging state. When the total voltage is higher than the third reference voltage, the power management integrated circuit 440 may, based on the voltages of the first and second batteries 410 and 420, control the charging current to be reduced in a stepwise manner.

In one embodiment, the power management integrated circuit 440 may identify the temperature of the electronic device 10 (e.g., temperatures of the first battery 410 or the second battery 420) and control the charging current based on the identified temperature. For example, when the identified temperature is equal to or below a reference temperature (e.g., 0° C.), the power management integrated circuit 440 may reduce the charging current by half as compared to when the temperature is higher than the reference temperature.

In one embodiment, the power management integrated circuit 440 may supply the remainder of the power from the external charger, which is connected to the electronic device 10, to the power input VSYS. In this embodiment, the power management integrated circuit 440 may process (e.g. down-convert the voltage level of the remainder of the power to correspond to the drive voltage of the system circuit) the remainder of the power from the external charger and supply the processed power to the power input VSYS. Further, the power management integrated circuit 440 may also supply power output from the first battery 410 and the second battery 420 to the power input VSYS of the electronic device 10.

In one embodiment, the power management integrated circuit 440 may output charging related information during the charging of the first and second batteries 410 and 420. The charging related information may include, for example, at least one of the temperature of the electronic device 10, the total charge current, and the total battery voltage. At least some of the operations performed by the power management integrated circuit 440 described above may be performed by the processor 470. For example, the power management integrated circuit 440 may transmit temperature-related information to the processor 470. When receiving a command for changing the charging current from the processor 470, the power management integrated circuit 440 may change the charging current. Further, the power management integrated circuit 440 may be implemented using at least a portion of a power management integrated circuit (PMIC), for example.

According to one embodiment, the first charging control circuit 450 may be connected in series between the first battery 410 and the power input VSYS of the electronic device 10. For example, the first charging control circuit 450 may electrically connect the first battery 410 and the power input VSYS with the power management integrated circuit 440 therebetween. In one embodiment, the first charging control circuit 450 may include a first path through which the charging current is input to the first battery 410, a second path through which the current of the first battery 410 is discharged, and a third path for charging the first battery 410 when the voltage of the first battery 410 is equal to or below the first reference voltage. At least a portion of the first path and the second path may overlap.

In one embodiment, while the first battery 410 is being charged by the power from the external charger supplied through the first path, the first charging control circuit 450 may perform a charging current limiting function based on a command of the processor 470. The first charging control circuit 450 may limit the current (charging current) input to the first battery 410 to be in a first specified range by performing the charging current limiting function. The first specified range may include, for example, a range between a first upper limit value inclusive and a first lower limit value exclusive. The first upper limit value may be experimentally set based on the capacity of the first battery 410, and for example may be equal to or below a maximum current value that does not cause damage to the first battery 410. For example, the first upper limit value may be set to 1 C or 2000 mA when the capacity of the first battery 410 is 2000 mAh. The first lower limit value may be set so as not to cause overcharge of the first battery 410, for example. For example, the first lower limit value may be set to 0.02 C.

In one embodiment, while the first battery 410 is supplying the power to the power input VSYS through the second path (i.e. while the first battery 410 is being discharged), the first charging control circuit 450 may perform a discharging current limiting function with respect to the first battery 410. The first charging control circuit 450 may limit discharging current output from the first battery 410 in a second specified range by performing the discharging current limiting function. The second specified range may include, for example, a range having values equal to or below a second upper limit value. The second upper limit value may be experimentally set based on the capacity of the first battery 410, for example, to equal to or below a maximum current value that does not cause damage to the first battery 410. The first specified range and the second specified range described above may be changed by the first charging control circuit 450 itself or based on the command of the processor 470.

In one embodiment, when the voltage of the first battery 410 is equal to or below the first reference voltage, and when the external charger is connected to the electronic device 10 and supplies current through the power management integrated circuit 440, the first charging control circuit 450 may provide the third path (e.g., close the third path) that may supply the current from the external charger to the first battery 410. However, the first charging control circuit 450 may limit the amount of the current supplied to the third path to a third upper limit value (e.g., 50 mA). In this case, because the first charging control circuit 450 (e.g., a processing core of the first charging control circuit 450) is not operating normally, the first path and the second path of the first charging control circuit 450 may be interrupted. The first charging control circuit 450 may interrupt the third path when the voltage of the first battery 410 is above the first reference voltage. In addition, the third path may interrupted in the power-off state of the electronic device 10.

In one embodiment, the first charging control circuit 450 may identify a state of the first battery 410 and output state information of the first battery 410. For example, the first charging control circuit 450 may output the state information including at least one of the voltage, current, and temperature of the first battery 410. To this end, the first charging control circuit 450 may include a temperature sensor and may be mounted adjacent to the first battery 410. The state information may include information indicating whether the first battery 410 is fully charged. The state information may be input to the processor 470. According to certain embodiments, at least one of the operations of the first charging control circuit 450 may be performed by the processor 470.

According to one embodiment, the second charging control circuit 460 may be connected in series between the second battery 420 and the power input VSYS of the electronic device 10. For example, the second charging control circuit 460 may electrically connect the second battery 420 and the power input VSYS, having the power management integrated circuit 440 and the connecting member 430 interposed therebetween. In one embodiment, the second charging control circuit 460 may include a fourth path through which the charging current is input to the second battery 420, a fifth path through which current of the second battery 420 is discharged, and a sixth path for charging the second battery 420 when the voltage of the second battery 420 is equal to or below the first reference voltage.

In one embodiment, while the second battery 420 is being charged by the power from the external charger supplied via the fourth path, the second charging control circuit 460 may perform the charging current limiting function based on the command of the processor 470. For example, the second charging control circuit 460 may limit the current (charging current) input to the second battery 420 to a third specified range by performing the charging current limiting function. The third specified range may include, for example, a range between a fourth upper limit value inclusive and a second lower limit value exclusive. The fourth upper limit value may be experimentally set based on the capacity of the second battery 420, and for example may be equal to or below a maximum current value that does not cause damage to the second battery 420. For example, the fourth upper limit value may be set to 1 C or 4000 mA when the capacity of the first battery 410 is 4000 mAh. The second lower limit value may be set so as not to cause overcharge of the second battery 420, for example. For example, the second lower limit may be set to 0.02 C.

In one embodiment, while the second battery 420 is supplying the power to the power input VSYS via the fifth path (i.e. while the second battery 420 is discharging), the second charging control circuit 460 may perform a discharging current limiting function based on a command of the processor 470. The second charging control circuit 460 may limit discharging current output from the second battery 420 to be in a fourth specified range by performing the discharging current limiting function. The fourth specified range may be, for example, equal to or below a fifth upper limit value. The fifth upper limit value may be experimentally set based on the capacity of the second battery 420, for example, to equal to or below a maximum current value that does not cause damage to the second battery 420. The third specified range and the fourth specified range described above may be changed by the second charging control circuit 460 itself or based on a command of the processor 470.

In one embodiment, the second charging control circuit 460 may interrupt at least one of the fourth to sixth paths based on a command of the processor 470. For example, upon receiving a command to disable discharging current flow (or to interrupt the fourth and fifth paths) from the processor 470 while performing the discharging current limiting function for the second battery 420, the second charging control circuit 460 may interrupt the fourth and fifth paths.

In one embodiment, when the voltage of the second battery 420 is equal to or below the first reference voltage, and when the external charger is connected to the electronic device 10 and supplies current through the power management integrated circuit 440, the second charging control circuit 460 may provide the sixth path (e.g., close the sixth path) that may supply the current from the external charger to the second battery 420. However, the second charging control circuit 460 may limit the amount of the current supplied to the sixth path to a sixth upper limit value (e.g., 50 mA). In this case, because the second charging control circuit 460 (e.g., a processing core of the second charging control circuit 460) is not operating normally, the fourth path and the fifth path of the first charging control circuit 450 may be interrupted. The second charging control circuit 460 may interrupt the sixth path when the voltage of the second battery 420 is above the first reference voltage. In addition, the sixth path of the second charging control circuit 460 may be interrupted in the power-off state of the electronic device 10.

In one embodiment, the second charging control circuit 460 may identify a state of the second battery 420 and output state information of the second battery 420. For example, the second charging control circuit 460 may output the state information including at least one of the voltage, current, and temperature of the second battery 420. To this end, the second charging control circuit 460 may include a temperature sensor and may be mounted adjacent to the second battery 420. The state information may include information indicating whether the second battery 420 is fully charged. The state information may be input to the processor 470. According to certain embodiments, at least one of the operations performed by the second charging control circuit 460 may be performed by the processor 470.

The processor 470 may perform calculations or data processing relating to control and/or communication of at least one other components of the electronic device 10 using instructions stored in a memory (not shown). The processor 470 may include, for example, at least one of a central processing unit (CPU), a graphics processing unit (GPU), a microprocessor, an application processor, an application specific integrated circuit (ASIC), or a field programmable gate arrays (FPGA), and may have a plurality of cores. In addition, the processor 470 may include a microprocessor or any suitable type of processing circuitry, such as one or more general-purpose processors (e.g., ARM-based processors), a Digital Signal Processor (DSP), a Programmable Logic Device (PLD), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to one embodiment, the processor 470 may identify an operation state of the electronic device 10 and control the first charging control circuit 450 and the second charging control circuit 460 based on the operation state of the electronic device 10. The operation state may include a charging operation state, a normal operation state, a low-power operation state, a power-off state, or the like. The charging operation state may include, for example, an operation state in which the first battery 410 and the second battery 420 are charged via the external charger. The normal operation state may include, for example, an operation state in which the display 100 is activated (ON). The low-power operation state may include, for example, at least one of a state in which the display 100 is deactivated (OFF), a folded state of the electronic device 10, or an idle state of the electronic device 10. The power-off state may include, for example, an operation state in which the power-off of the electronic device 10 is in progress. The processor 470 may communicate with the first charging control circuit 450 and the second charging control circuit 460 via a specified protocol (e.g., I2C). As described above, the folded state of the electronic device 10 may be a state in which an internal angle between the first bracket 310 and the second bracket 320 is minimized, for example.

According to one embodiment, when the identified operation state is the charging operation state, the processor 470 may transmit a first command for instructing the execution of the charging current limiting function to the first charging control circuit 450 and the second charging control circuit 460. Upon receiving the command when the voltage of the first battery 410 is above the first reference voltage, the first charging control circuit 450 may limit the current supplied to the first battery 410 to be in the first specified range. Upon receiving the first command when the voltage of the second battery 420 is above the first reference voltage, the second charging control circuit 460 may limit the current supplied to the second battery 420 to be in the third specified range. According to one embodiment, the processor 470 may transmit information related to the first specified range when transmitting the first command to first charging control circuit 450. The processor 470 may also transmit information related to the third specified range when transmitting the first command to the second charging control circuit 460. The information related to the first specified range may include, for example, information that causes the first charging control circuit 450 to change the first specified range.

According to one embodiment, when the identified operation state is the normal operation state, the processor 470 may transmit a second command for instructing the execution of the discharging current limiting function to the first charging control circuit 450 and the second charging control circuit 460. Upon receiving the second command, the first charging control circuit 450 may limit the current supplied from the first battery 410 to be in the second specified range. Upon receiving the second command, the second charging control circuit 460 may limit the current supplied from the second battery 420 to be in the fourth specified range. According to one embodiment, the processor 470 may transmit information related to the second specified range when transmitting the second command to first charging control circuit 450. The processor 470 may also transmit information related to the fourth specified range when transmitting the second command to the second charging control circuit 460.

According to one embodiment, when the identified operation state is the low-power operation state or the power-off state, the processor 470 may transmit a third command for instructing the second charging control circuit 460 to interrupt the fourth and fifth paths. Upon receiving the third command, the second charging control circuit 460 may interrupt the fourth and fifth paths, and may switch the second battery 420 to be in the no-load state. Further, when the identified operation state is the low-power operation state or the power-off state, the processor 470 may transmit a fourth command for instructing the first charging control circuit 450 to deactivate the discharging current limiting function. Upon receiving the fourth command, the first charging control circuit 450 deactivates the discharging current limiting function such that the current output from the first battery 410 may not be limited. In one embodiment, the processor 470 may transmit the fourth command after a specified time interval has lapsed after transmitting the third command. The specified time interval may be set to exceed the time required for the fourth and fifth paths to be interrupted by the second charging control circuit 460.

According to one embodiment, the processor 470 may receive information relate to charging, the state information of the first battery 410, and the state information of the second battery 420 respectively from the power management integrated circuit 440, the first charging control circuit 450, and the second charging control circuit 460. In one embodiment, the processor 470 may transmit a command to change at least one of the total charging current, the first specified range, the second specified range, the third specified range, or the fourth specified range based on at least one of the information related to charging, the state information of the first battery 410, or the state information of the second battery 420. For example, when the temperature of the first battery 410 is above a specified temperature, the processor 470 may transmit a command for lowering the first and second specified ranges to the first charging control circuit 450. In another example, when the temperature of the second battery 420 is above a specified temperature, the processor 470 may transmit a command for lowering the third and fourth specified ranges to the second charging control circuit 460. In still another example, when the temperature of the electronic device 10 is equal to or below the reference temperature, the processor 470 may transmit a command for halving the total charging current to the power management integrated circuit 440 and may transmit commands, to the first charging control circuit 450 and the second charging control circuit 460, for changing the first through fourth specified ranges.

In one embodiment, the processor 470 may output, via the display 100, the state information of the first battery 410 or the state information of the second battery 420. For example, upon identifying that the first battery 410 is fully charged based on the voltage or current of the first battery 410 in the charging operation state, the processor 470 may output information indicating that the first battery 410 is fully charged via the display 100. Further, upon identifying that the second battery 420 is fully charged based on the voltage or current of the second battery 420 in the charging operation state, the processor 470 may output information indicating that the second battery 420 is fully charged via the display 100. In addition, the processor 470 may output remaining capacity information of at least one of the first battery 410 or the second battery 420 in the charging operation state or the discharging operation state (e.g., normal operation state, low-power operation state, and the like).

According to the above-described embodiment, the processor 470 may prevent the first battery 410 and the second battery 420 from being damaged due to overcharging or over-discharging by limiting the charging/discharging current of the first battery 410 and the second battery 420 using the first charging control circuit 450 and the second charging control circuit 460. Further, according to the above-described embodiment, the processor 470 drives only necessary portions of internal blocks of the first charging control circuit 450 and the second charging control circuit 460 in a current operating state of the electronic device 10 such that power that is unnecessary consumed by the first charging control circuit 450 and the second charging control circuit 460 may be reduced.

According to one embodiment, an electronic device may include: a housing having a first housing structure (e.g., the first housing structure 510 in FIG. 1, FIG. 2, and FIG. 3) and a second housing structure (e.g., the second housing structure 520 in FIG. 1, FIG. 2, and FIG. 3), wherein the first and second housing structures are foldable with respect to each other about a hinge axis (e.g., the hinge-cover 530 in FIG. 1); a processor (e.g., the processor 470 in FIG. 4) disposed in the housing; a first battery (e.g., the first battery 410 in FIG. 4) disposed in the first housing structure; a second battery (e.g., the second battery 420 in FIG. 4) disposed in the second housing; a flexible printed circuit board (FPCB) (B2B FPCB in FIG. 5) extending from the first housing structure to the second housing structure and crossing the hinge axis; a power management integrated circuit (PMIC) (e.g., the power management integrated circuit 440 in FIG. 4) disposed in the first housing structure and electrically connected to the processor and the FPCB; a first charging control circuit (e.g., the first charging control circuit 450 in FIG. 4) disposed in the first housing structure and electrically connected to the power management integrated circuit, the processor, the first battery, and the FPCB; and a second charging control circuit (e.g., the second charging control circuit 460 in FIG. 4) disposed in the second housing structure and electrically connected to the power management integrated circuit, the processor, the second battery, and the FPCB.

The first charging control circuit may include a first charging path including a first switch (e.g., a switch MP1 in FIG. 6) and a first diode (e.g., a diode D1 in FIG. 6) and a second charging path including at least one transistor (e.g., a first transistor MN1 and a second transistor MN2 in FIG. 6), wherein both the first and second paths are disposed between the power management integrated circuit and the first battery.

The electronic device or the first charging control circuit may further include: a first controller (e.g., a first controller CP1 and a second controller CP2 in FIG. 6) configured to use the at least one transistor to control charging current and/or discharging current of the first battery; and a second controller (e.g., a third controller CP3 in FIG. 6) configured to turn on the first switch when voltage of the first battery is equal to or below a specified voltage, thereby to allow current to flow through the first charging path, and to turn off the first switch when the voltage of the first battery is above the specified voltage, thereby to interrupt the current flowing through the first charging path.

Figure 6:
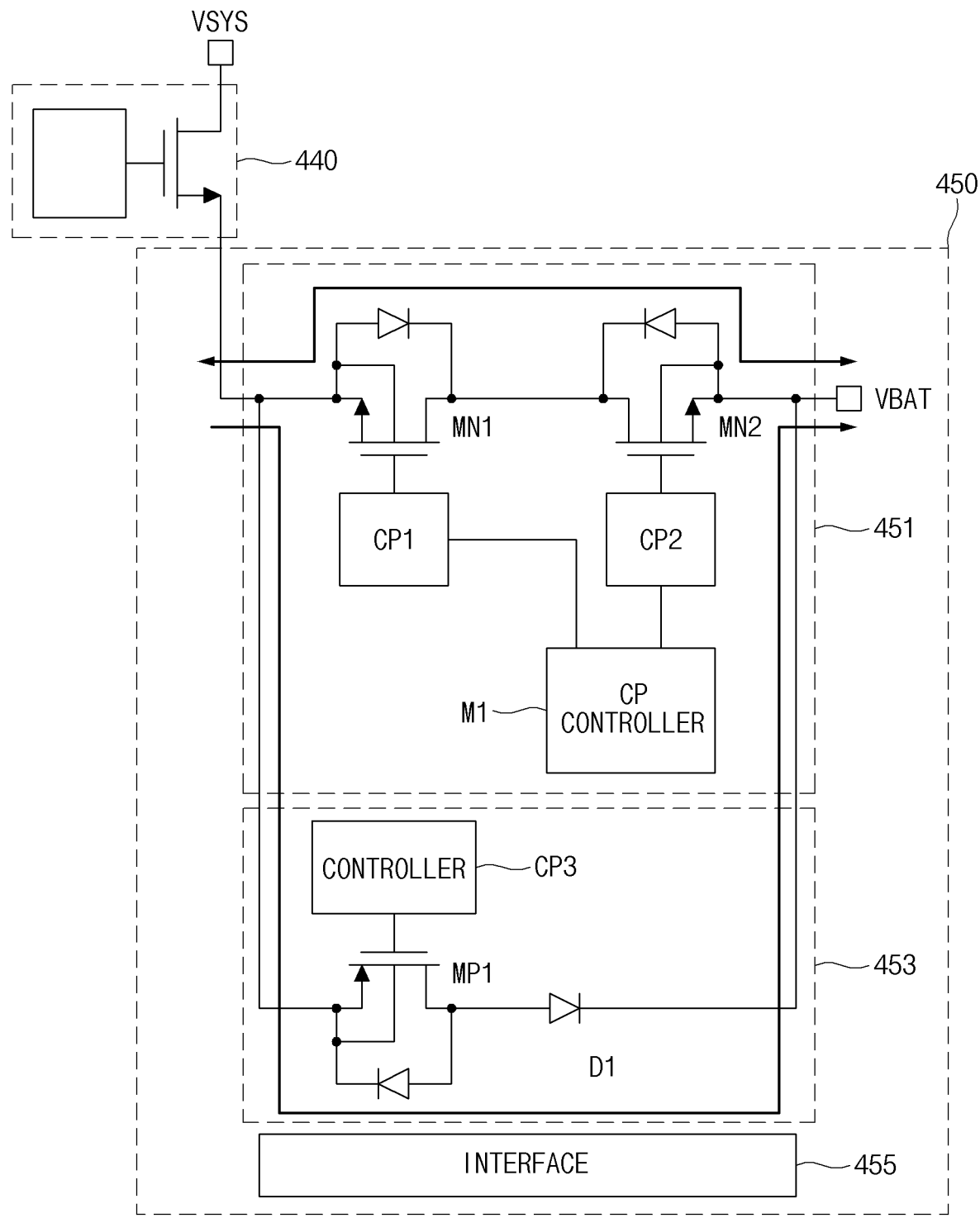
FIG. 6 is a circuit diagram illustrating a detailed configuration of a first battery manager according to an embodiment.

The second charging control circuit may include a third charging path including a second switch (e.g., the switch MP1 in FIG. 6) and a second diode (such as the diode D1 in FIG. 6) and a fourth charging path including at least one transistor (e.g., the first transistor MN1 and the second transistor MN2 in FIG. 6), wherein both the third and fourth paths are disposed between the power management integrated circuit and the second battery.

The electronic device or the second charging control circuit may further include: a third controller (e.g., the first controller CP1 and the second controller CP2 in FIG. 6) configured to use the at least one transistor to control the charging current and/or discharging current of the second battery; and a fourth controller (e.g., the third controller CP3 in FIG. 6) configured to turn on the second switch when voltage of the second battery is equal to or below a specified voltage, thereby to allow current to flow through the third charging path, and to turn off the second switch when the voltage of the second battery is above the specified voltage, thereby to interrupt the current flowing through the third charging path.

According to one embodiment, a foldable electronic device (e.g., the electronic device 10 in FIG. 1) may include: a first bracket (e.g., the first bracket 310 in FIG. 1); a second bracket (e.g., the second bracket 320 in FIG. 1); a hinge structure (e.g., the hinge-cover 530 in FIG. 1) constructed to adjust an angle between the first bracket and the second bracket; a first battery (e.g., the first battery 410 in FIG. 4) disposed on one side of the first bracket; a second battery (e.g., the second battery 420 in FIG. 4) disposed on one side of the second bracket; a connecting member (e.g., the connecting member 430 in FIG. 5) including a portion disposed between the first bracket and the second bracket, and connecting the first battery and the second battery in parallel; a first charging control circuit (e.g., the first charging control circuit 450 in FIG. 4) disposed on one side of the first bracket for limiting input or output current into or from the first battery; a second charging control circuit (e.g., the second charging control circuit 460 in FIG. 4) disposed on one side of the second bracket for limiting input or output current into or from the second battery; and a processor (the processor 470 in FIG. 4) operatively connected to the first battery, the second battery, the first charging control circuit, and the second charging control circuit. The processor may be configured to: identify an operation state of the foldable electronic device; and when the operation state is a first operation state, control the first charging control circuit to limit a charging current of the first battery to be in a first specified range, and control the second charging control circuit to limit a charging current of the second battery to be in a second specified range. Further, when the operation state is a second operation state, the processor may be configured to control the first charging control circuit to limit a discharging current of the first battery to be in a third specified range, and control the second charging control circuit to limit a discharging current of the second battery to be in a fourth specified range. Further, when the operation state is a third operation state, the processor may be configured to control the second charging control circuit to interrupt flow of the discharging current of the second battery.

The processor may be configured to transmit a command to instruct the first charging control circuit to cease limiting the discharging current of the first battery when the operation state is the third operation state.

The processor may be configured to transmit the command after a specified time interval has lapsed from the flow of the discharging current of the second battery being disabled by the second charging control circuit.

The specified time interval may exceed a time required for transmitting the command and for the second charging control circuit to interrupt the flow of the discharging current of the second battery.

The first operation state may include a state in which, when an external charger is connected to the foldable electronic device, each of voltages of the first battery and the second battery is above a first reference voltage, charging current from the external charger is supplied to the first battery via the first charging control circuit, and the charging current from the external charger is supplied to the second battery via the second charging control circuit.

According to one embodiment, the electronic device may further include a display (e.g. the display 100 in FIG. 1), and in the second operation state the display is activated while an external charger is disconnected from the foldable electronic device.

According to one embodiment, the electronic device may further include a display, and the third operation state may include a state in which the display is deactivated when an external charger is disconnected from the foldable electronic device, a folded state of the foldable electronic device in which the internal angle between the first bracket and the second bracket is minimized, and/or an idle state of the foldable electronic device.

The first charging control circuit may provide: a first path through which the charging current of the first battery flows; and a second path through which the discharging current of the first battery flows. Further, the second charging control circuit may provide: a third path through which the charging current of the second battery flows; and a fourth path through which the discharging current of the second battery flows. The processor may be configured to open the first path and to close (make a short-circuit) the second path when the charging current of the first battery is equal to or below a lower limit value of the first specified range in a state where a voltage of the first battery is above a second reference voltage, while the foldable electronic device is in the first operation state. The processor may be configured to open the third path and to close (make a short-circuit) the fourth path when the charging current of the second battery is equal to or below a lower limit value of the second specified range in a state where a voltage of the second battery is above a second reference voltage, while the foldable electronic device is in the first operation state.

The first charging control circuit may be configured to include a third path through which the charging current of the first battery flows when voltage of the first battery is equal to or below a first reference voltage, and to interrupt the third path of the first charging control circuit when the voltage of the first battery is above the first reference voltage. The second charging control circuit may be configured to include a third path through which a charging current of the second battery flows when voltage of the second battery is equal to or below the first reference voltage, and to interrupt the third path of the second charging control circuit when the voltage of the second battery is above the first reference voltage.

The processor may be configured to receive state information of the first battery from the first charging control circuit and/or receive state information of the second battery from the second charging control circuit, and to change the first specified range, the second specified range, the third specified range, and/or the fourth specified range based on the state information.

The state information of the first battery may include information regarding temperature, voltage, the charging current, and/or the discharging current of the first battery, and the state information of the second battery may include information regarding temperature, voltage, the charging current, and/or the discharging current of the second battery.

According to one embodiment, the electronic device may further include a display, and the processor may be configured to receive state information of the first battery from the first charging control circuit and/or receive state information of the second battery from the second charging control circuit, and to output, on the display, at least a portion of the state information of the first battery and/or the state information of the second battery.

According to one embodiment, the electronic device may include: a power input VSYS of a system circuit configured to receive the discharging currents of the first battery and the second battery; and a power management integrated circuit 440 configured to control charging of the first and second batteries and to supply power, to the power input, from the first battery, the second battery, or an external charger connected to the foldable electronic device. The first battery and the second battery may have the same capacity and may have different impedances loaded on the power management integrated circuit due to a member including the connecting member for connecting the first battery and the second battery in parallel.

Figure 5:
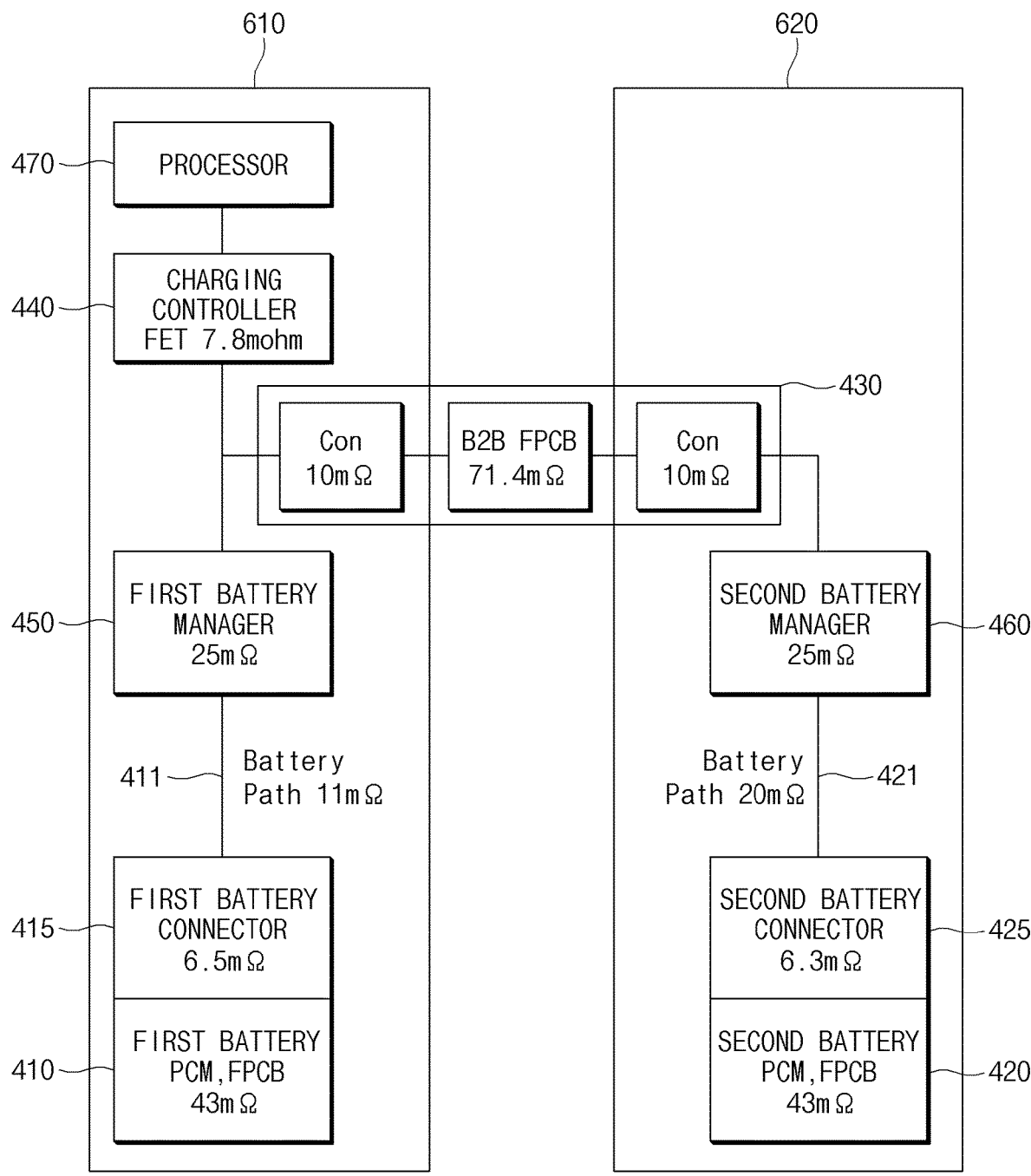
FIG. 5 is a block diagram illustrating an impedance deviation between a first battery 410 and a second battery 420 according to an embodiment.

FIG. 5 is a block diagram illustrating an impedance deviation between the first battery 410 and the second battery 420 according to an embodiment.

Referring to FIG. 5, as described above, the power management integrated circuit 440 may control the (charging) current supplied to the first battery 410 and the second battery 420 based on at least one of the total voltage (i.e. parallel voltage) or the total current of the first battery 410 and the second battery 420. Further, the impedance of the first battery 410 loaded on the power management integrated circuit 440 may include the impedance of first members that connect the power management integrated circuit 440 and the first battery 410 in addition to the self impedance (for example 43 mΩ) of the first battery 410. The self impedance (43 mΩ) of the first battery 410 may include the impedance of the flexible printed circuit board (FPCB) that connects a first battery connector 415 and the first battery 410 and the impedance of a protection circuit module (PCM) included in the first battery 410. The impedance of the first members may include the impedance (for example 25 mΩ) of the first charging control circuit 450, the impedance (for example 11 mΩ) of a pattern 411 that connects the first charging control circuit 450 and the first battery connector 415, and the impedance (for example 6.3 mΩ) of the first battery connector 415 that connects the first substrate 610 and the first battery 410. Further, the impedance of the second battery 420 loaded on the power management integrated circuit 440 may include the impedance of second members that connect the power management integrated circuit 440 and the second battery 420 in addition to a self impedance (for example 43 mΩ) of the second battery 420. The self impedance (43 mΩ) of the second battery 420 may include the impedance of the flexible printed circuit board (FPCB) that connects a second battery connector 425 and the second battery 420 and the impedance of a protection circuit module (PCM) included in the second battery 420. The impedance of the second members may include the impedance (for example 91.4 mΩ=10 mΩ+71.4 mΩ+10 mΩ) of the connecting member 430, the impedance (for example 25 mΩ) of the second charging control circuit 460, the impedance (for example 20 mΩ) of a pattern 421 that connects the second charging control circuit 460 and a second battery connector 425, and the impedance (for example 6.3 mΩ) of the second battery connector 425 that connects the second substrate 620 and the second battery 420. As such, even though the impedance of the first battery 410 and the impedance of the second battery 420 are equal, the impedances of the first battery 410 and the second battery 420 loaded on the power management integrated circuit 440 are different from each other due to the impedances of the first members and the second members. Thus, when the power management integrated circuit 440 controls the charging currents supplied to the first battery 410 and the second battery 420 together based on the parallel voltage of the first battery 410 and the second battery 420, if current is not limited by the first charging control circuit 450 and the second charging control circuit 460, the first battery 410 and the second battery 420 may be overcharged. Further, when the discharging currents of the first battery 410 and the second battery 420 are also supplied to the power input (VSYS) of the electronic device 10 without the current limitation by the first charging control circuit 450 and the second charging control circuit 460, the first battery 410 and the second battery 420 may be over-discharged. However, according to one embodiment, the first charging control circuit 450 and the second charging control circuit 460 may limit the charging currents and the discharging currents respectively for the first and second batteries 410 and 420 such that the overcharging and the over-discharging of the first battery 410 and the second battery 420 may be prevented.

FIG. 6 is a circuit diagram illustrating a detailed configuration of a first charging control circuit according to an embodiment.

Referring to FIG. 6, according to one embodiment, the first charging control circuit 450 may include a charging/discharging controller 451, a low voltage controller 453, and an interface 455.

According to one embodiment, the charging/discharging controller 451 may provide the first path through which the charging current for the first battery 410 flows and the second path through which the discharging current of the first battery 410 flows. At least one portion of the first path and the second path may overlap. The charging/discharging controller 451 may include the first transistor MN1, the second transistor MN2, the first controller CP1, the second controller CP2, and the monitoring unit M1.

The monitoring unit M1 may monitor charging current or discharging current passing through the first transistor MN1 and the second transistor MN2.

The first controller CP1 may turn on or turn off the first transistor MN1 based on a command received from the processor 470, and the second controller CP2 may turn on or turn off the second transistor MN2 based on a command received from the processor 470. The first controller CP1 and the second controller CP2 may respectively turn on the first transistor MN1 and the second transistor MN2 when charging or discharging the first battery 410.

The first controller CP1 may control switching of the first transistor MN1 such that the charging current monitored by the monitoring unit M1 is within the first specified range. The first path as described above may be a path through which the charging current for the first battery 410 is supplied from the power management integrated circuit 440 to the first battery 410 via the first transistor MN1 and the second transistor MN2. The first specified range may be, for example, between the first upper limit value inclusive and the first lower limit value exclusive. The first upper limit value may be changed based on the voltage of the first battery 410. For example, the first upper limit value may be set to about 450 mA when the voltage of the first battery 410 is above the first reference voltage and equal to or below the second reference voltage. Alternatively, when the voltage of the first battery 410 is above the second reference voltage, the first upper limit value may be set to 1 C (e.g., when the capacity of the first battery 410 is about 1000 mAh, the first upper limit value may be set to about 1000 mA). According to one embodiment, the switching of the first transistor MN1 may be controlled by the monitoring unit M1. According to the above-described embodiment, the charging current may be gradually increased based on the voltage of the first battery 410 to prevent the first battery 410 from being damaged.

The second controller CP2 may control switching of the second transistor MN2 such that the discharging current monitored by the monitoring unit M1 is within the second specified range. The second path described above may be a path through which the discharging current of the first battery 410 flows from the first battery 410 to the power management integrated circuit 440 via the second transistor MN2 and the first transistor MN1. The second specified range may be, for example, a range having values equal to or below the second upper limit value. According to one embodiment, the switching of the second transistor MN2 may be controlled by the monitoring unit M1.

According to one embodiment, the low voltage controller 453 may include a third path through which the charging current for the first battery 410 flows when the voltage of the first battery 410 is equal to or below the first reference voltage. The low voltage controller 453 may include the third controller CP3, the switch MP1, and a diode D1.

The switch MP1 may be provided between the power management integrated circuit 440 and the first battery 410 and may be turned on or turned off under control of the third controller CP3. The third controller CP3 or the switch MP1 may limit the amount of current supplied to the first battery 410 via the switch MP1 to be equal to or below the third upper limit value (e.g., 50 mA). For example, the third controller CP3 may turn on the switch MP1 when the voltage of the first battery 410 is equal to or below the first reference voltage, and turn off the switch MP1 when the voltage of the first battery 410 is above the first reference voltage. The low voltage controller 453 may operate independently from the processor 470 such that it may turn on or turn off the switch MP1 without receiving a command from the processor 470.

The diode D1 may be provided at an output of the switch MP1 to allow the current from the output of the switch MP1 to be provided to the first battery 410 and to prevent the current from the first battery 410 to flow the switch MP1.

According to one embodiment, the interface 455 may identify the state information of the first battery 410 (e.g., at least one of whether the first battery 410 is fully charged, the voltage, or the charging/discharging current of the first battery 410), and output the identified state information of the first battery 410. In one embodiment, the interface 455 may deliver the command received from the processor 470 to the charging/discharging controller 451 and/or to the low voltage controller 453. The interface 455 may communicate with the processor 470 via a specified protocol (e.g., I2C), for example.

According to one embodiment, the second charging control circuit 460 may include the same or similar configuration as the first charging control circuit 450, and may perform operations corresponding to those of the first charging control circuit 450.

Figure 7:
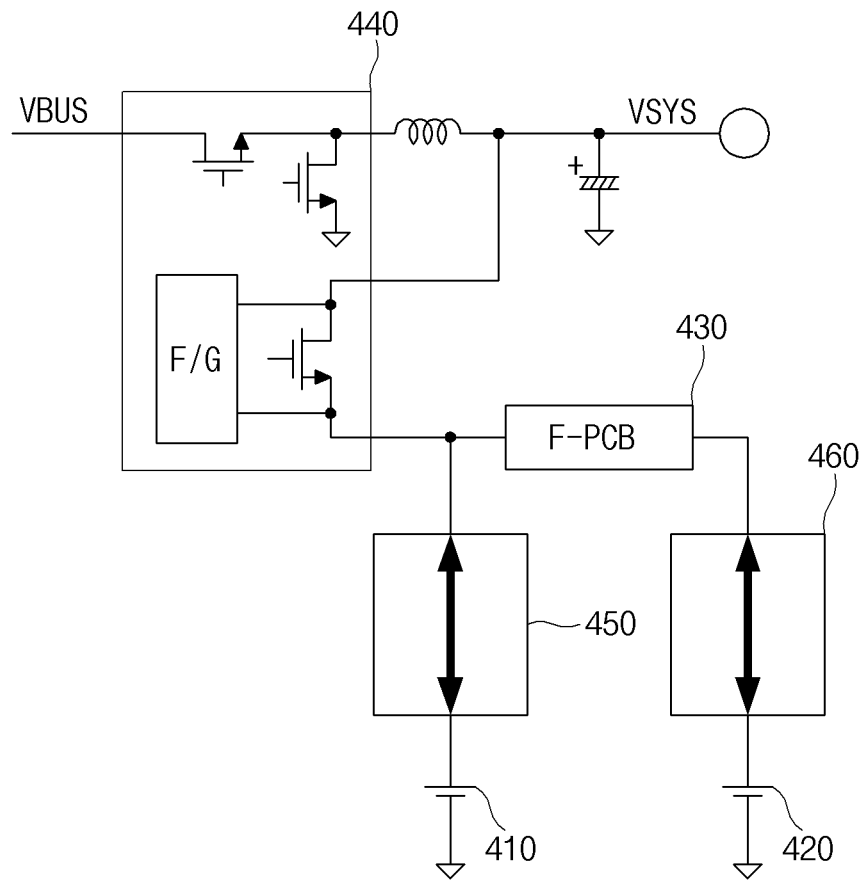
FIG. 7 is a circuit diagram illustrating current flow in a first battery manager and a second battery manager in a charging operation state and a normal operation state according to an embodiment.

FIG. 7 is a circuit diagram illustrating current flow in the first charging control circuit 450 and the second charging control circuit 460 in a charging operation state and a normal operation state according to an embodiment.

Referring to FIG. 7, in the charging operation state of the electronic device 10, the charging current supplied from the external charger to the first battery 410 may be supplied to the first battery 410 through the first path of the first charging control circuit 450. Similarly, the charging current supplied from the external charger to the second battery 420 may be supplied to the second battery 420 through the first path of the second charging control circuit 460.

Further, in the normal operation state of the electronic device 10, the discharging current of the first battery 410 supplied from the first battery 410 to the power input VSYS may be output from the first battery 410 through the second path of the first charging control circuit 450. In the normal operation state of the electronic device 10, the discharging current of the second battery 420 supplied from the second battery 420 to the power input VSYS may be output from the second battery 420 through the second path of the second charging control circuit 460.

Figure 8:
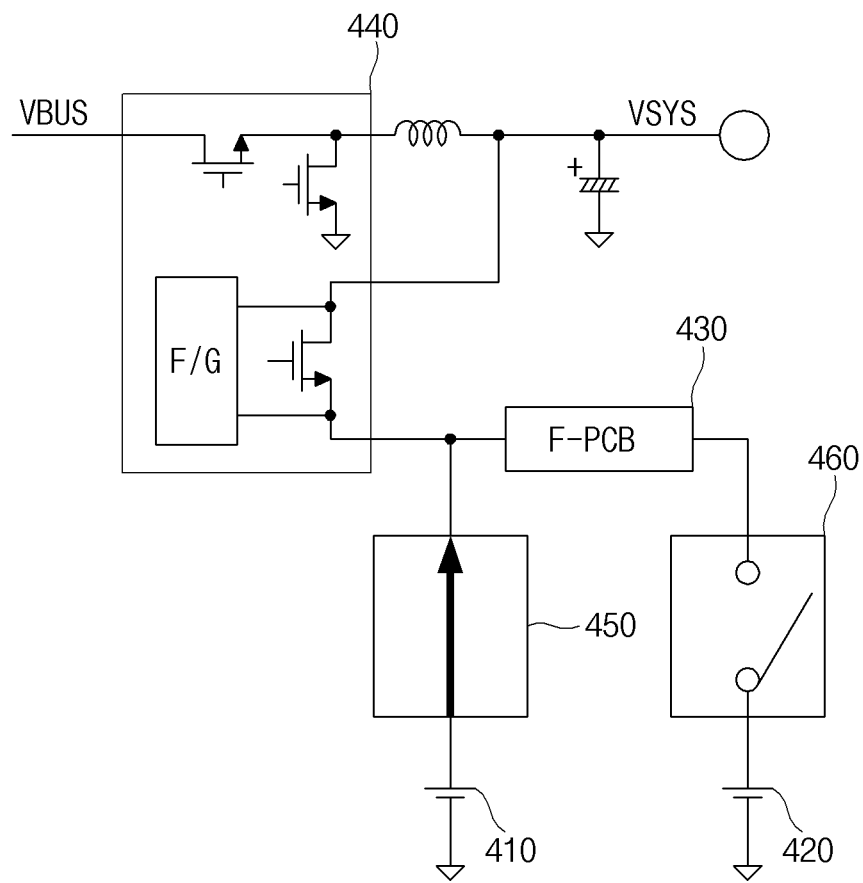
FIG. 8 is a circuit diagram illustrating current flow between a power management integrated circuit, a first battery manager, and a second battery manager in a low-power operation state or a power-off state according to an embodiment.

FIG. 8 is a circuit diagram illustrating current flow between the power management integrated circuit 440, the first charging control circuit 450, and the second charging control circuit 460 in a low-power operation state or a power-off state according to an embodiment.

Referring to FIG. 8, according to one embodiment, in the low-power operation state or the power-off state of the electronic device 10, the second charging control circuit 460 may interrupt the fourth to sixth paths in response to the command from the processor 470. In this case, the second battery 420 may be in the no-load state. In this case, the first charging control circuit 450 may supply the discharging current of the first battery 410 to the power input VSYS through the second path based on the command of the processor 470 but may not perform the current limiting function for the discharging current of the first battery 410.

Figure 9:
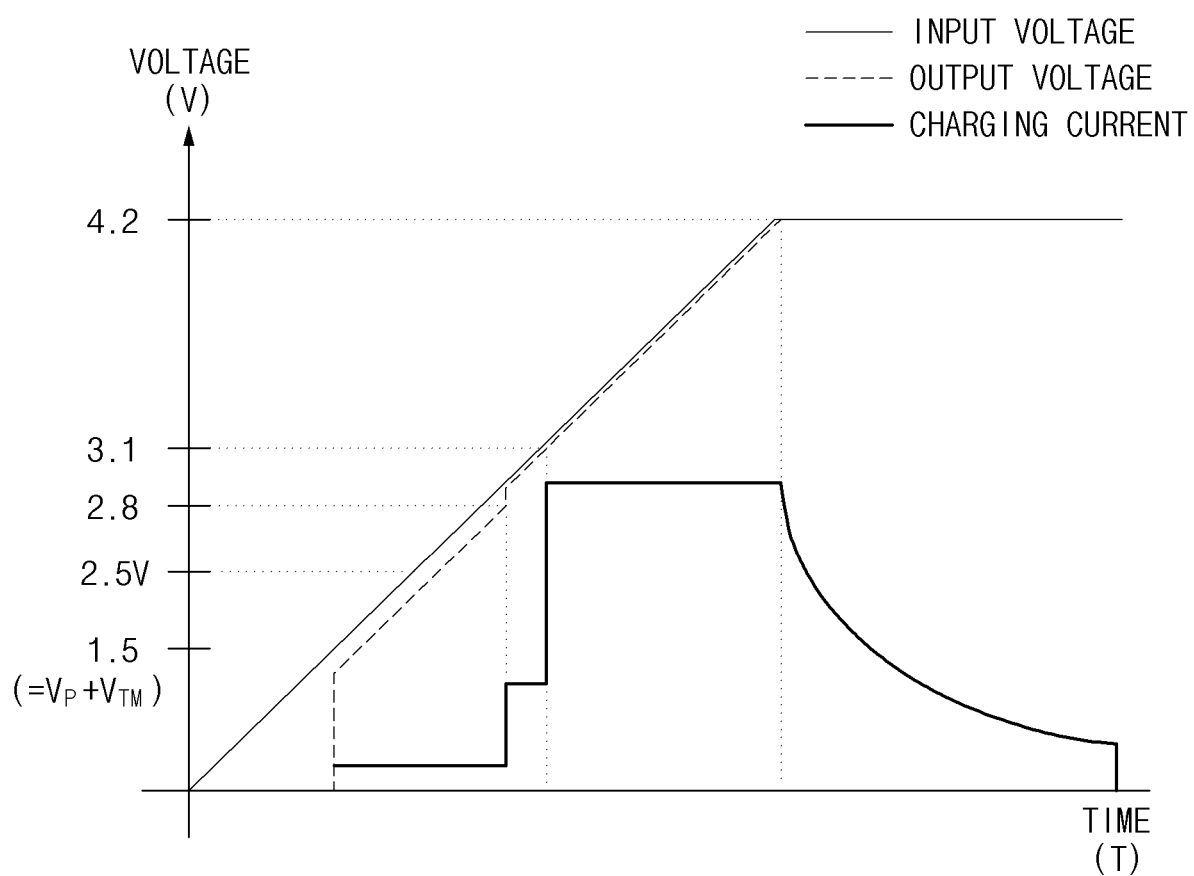
FIG. 9 is a graph illustrating a battery charging curve based on voltage of a battery according to an embodiment.

FIG. 9 is a graph illustrating a battery charging curve based on voltage of a battery (e.g. the first battery 410 in FIG. 4) according to an embodiment. The input voltage shown in FIG. 9 may be an input voltage of the first path of the first charging control circuit 450, and the output voltage shown in FIG. 9 may be an output voltage of the first path of the first charging control circuit 450 (or the voltage of a positive voltage terminal of the first battery 410).

Referring to FIG. 9, when the voltage of the first battery 410 is equal to or below the first reference voltage (e.g., 2.5V), the first charging control circuit 450 may supply the charging current equal to below the third upper limit value (e.g., about 50 mA) to the first battery 410 through the third path. When the voltage of the first battery 410 is equal to or below the first reference voltage, the first charging control circuit 450 may supply the charging current equal to or below the third upper limit value to the first battery 410 through the third path even independent of the processor 470.

When the voltage of the first battery 410 is above the first reference voltage, the first charging control circuit 450 may supply the charging current within the first specified range to the first battery 410. The first specified range may include a range between the first upper limit value inclusive and the first lower limit value exclusive. The first upper limit value may be set differently based on the voltage of the first battery 410. For example, the first upper limit value may be set to 450 mA when the voltage of the first battery 410 is above the first reference voltage and equal to or below the second reference voltage, and may be set to 1 C (e.g., about 1 A when the capacity of the first battery 410 is 2000 mAh) when the voltage of the first battery 410 is above the second reference voltage (e.g., 3.1V). As such, according to the above-described embodiment, the first charging control circuit 450 may limit supply of overcurrent to the first battery 410 during the charging of the first battery 410 to prevent the first battery 410 from being damaged.

When the voltage of the first battery 410 is above the first reference voltage, the first charging control circuit 450 may determine whether the charging current of the first battery 410 is above the first lower limit value. When the charging current of the first battery 410 is equal to or below the first lower limit value, the first charging control circuit 450 may interrupt the first path of the first charging control circuit 450 and close the second path of the first charging control circuit 450. Thus, according to the above-described embodiment, when the first battery 410 is fully-charged, the first charging control circuit 450 controls the first battery 410 not to be charged any longer and to be discharged, thereby preventing the first battery 410 from being damaged due to the overcharging.

When the voltage of the first battery 410 is above a second reference voltage (e.g. 3.1V) and equal to or below a third reference voltage (e.g., 4.1V), the first charging control circuit 450 may supply charging current of 1 C to the first battery 410. This state may be referred to as the constant current charging state. And when the voltage of the first battery 410 is above the third reference voltage, the first charging control circuit 450 may control the charging current to be reduced gradually.

Figure 10:
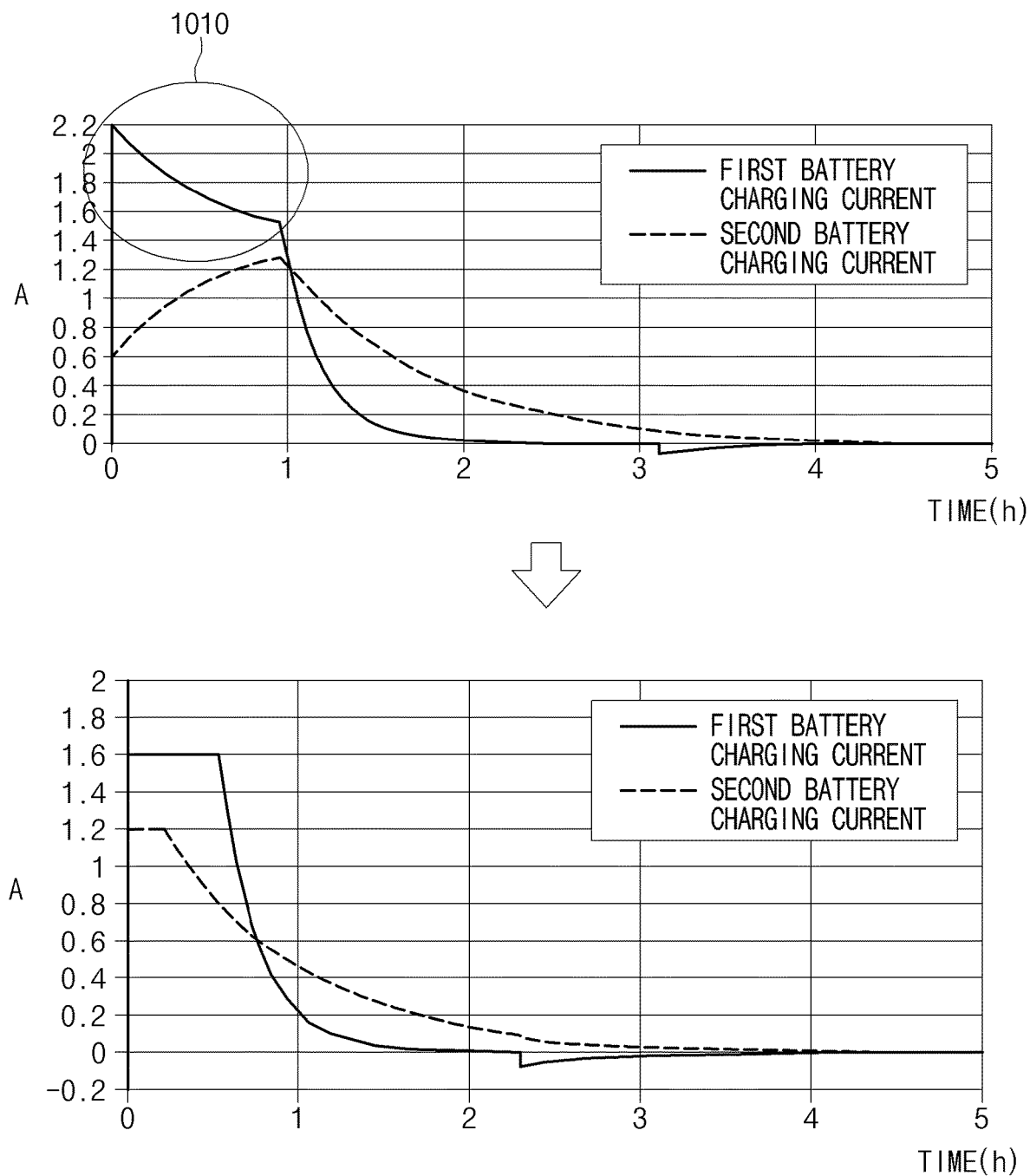
FIG. 10 is graphs illustrating battery charging curves before and after application of a first and a second battery manager (e.g., a first and a second battery manager 450 and 460 in FIG. 4) according to an embodiment.

FIG. 10 is graphs illustrating battery charging curves before and after application of a first and a second battery charging circuit (e.g., the first and the second charging circuits 450 and 460 in FIG. 4) according to an embodiment. The upper graph in FIG. 10 shows charging curves of the first and second batteries 410 and 420 before application of the first and second charging control circuits 450 and 460, and the lower graph in FIG. 10 shows charging curves of the first and second batteries 410 and 420 after the application of the first and second charging control circuits 450 and 460. In FIG. 10, the positive (+) values on the y axis indicate the input current of the first and second batteries 410 and 420, and the negative (−) values indicate the output current of the first and second batteries 410 and 420.

Referring to the upper graph in FIG. 10, when the electronic device does not include the first and second charging control circuits 450 and 460, a greater portion of the total charging current is supplied to the first battery 410 (see a region 1010), which has a relatively low impedance loaded on the power management integrated circuit 440, as compared to the second battery 420, thereby the overcharging of the first battery 410 may occur.

However, as shown in the lower graph in FIG. 10, when the electronic device 10 includes the first and second charging control circuits 450 and 460, the charging currents of the first battery 410 and the second battery 420 are respectively limited within the first and third specified range by the first charging control circuit 450 and the second charging control circuit 460, thereby the overcharging of the first battery 410 as shown in the upper graph in FIG. 10 may be improved.

Table 1 is a table showing power consumption of the first and second charging control circuits depending on the operation state of the electronic device according to one embodiment.

TABLE 1

| | First charging control circuit | Second charging control circuit | Description |
|---|---|---|---|
| Normal operation mode | Current limiting function on (150 uA) | Current limiting function on (150 uA) | |
| Power-off mode (voltages of first and second batteries are above first reference voltage) | Current limiting function off (30 uA) | Interrupt path (0 uA) | Low-power operation state or power-off operation state |
| Power-off mode (voltages of first and second batteries are equal to or below a first reference voltage) | Off (0 uA) | Off (0 uA) | First and second batteries are in no-load state due to protection circuit module of first and second batteries |

Referring to Table 1, in the normal operation state of the electronic device, the first charging control circuit 450 and the second charging control circuit 460 may perform the current limiting function. In this case, the first charging control circuit 450 and the second charging control circuit 460 may consume current of about 150 uA.

In a situation where the first and second batteries 410 and 420 are above the first reference voltage, and when the operation state of the electronic device is the power-off state, the second charging control circuit 460 interrupts the fourth to sixth paths, thereby not consuming the current, and the first charging control circuit 450 provides the second path through which the discharging current of the first battery 410 flows, but does not perform the current limiting function so that the first charging control circuit 450 may consume approximately 30 uA.

In a situation where the first and second batteries 410 and 420 are equal to or below the first reference voltage, and when the operation state of the electronic device is the power-off state, the first and second batteries 410 and 420 may be enter the no-load state by the protection circuit module (PCM) included in the first and second batteries 410 and 420. In this case, the first and second charging control circuits 450 and 460 may not receive current, thereby not consuming any current. As such, according to the above-described embodiment, the first and second batteries 410 and 420 are protected by the first and second charging control circuits 450 and 460 so that unnecessary current consumption may be improved.

Figure 11:
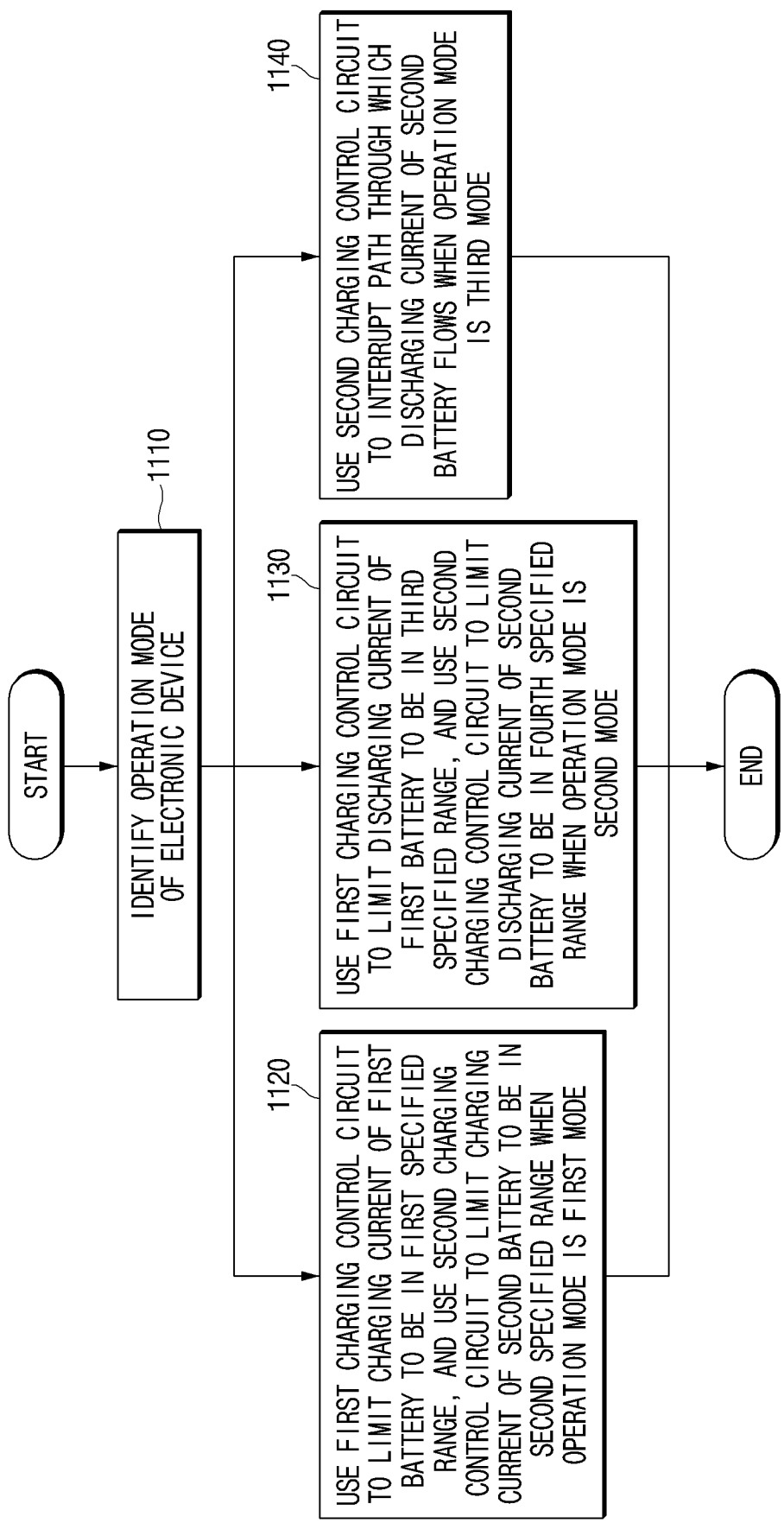
FIG. 11 is a flowchart of a method for managing a battery according to an embodiment.

FIG. 11 is a flowchart of a method for managing a battery according to an embodiment.

Referring to FIG. 11, in operation 1110, the processor 470 (e.g., the processor 470 in FIG. 4) may identify the operation state of the electronic device 10.

In operation 1120, when the operation state is the first operation state, the processor 470 may use the first charging control circuit 450 to limit the charging current of the first battery 410 to be in the first specified range, and use the second charging control circuit 460 to limit the charging current of the second battery 420 to be in the second specified range. The first operation state (the charging operation state described above) may include, for example, a situation where the external charger is connected to the electronic device 10 and a situation where the voltages of the first battery 410 and the second battery 420 are above the first reference voltage. Further, the first operation state may include, in the above situations, a state in which the charging current from the external charger is supplied to the first battery 410 via the first charging control circuit 450 and the charging current from the external charger is supplied to the second battery 420 via the second charging control circuit 460.

In operation 1130, when the operation state is the second operation state (the normal operation state described above), the processor 470 may use the first charging control circuit 450 to limit the discharging current of the first battery 410 to be in the third specified range, and use the second charging control circuit 460 to limit the discharging current of the second battery 420 to be in the fourth specified range. The second operation state may include, for example, a state in which the external charger is not connected to the electronic device 10 and the display 100 is activated.

In operation 1140, when the operation state is the third operation state (the low-power operation state described above), the processor 470 may use the second charging control circuit 460 to interrupt the path through which the discharging current of the second battery 420 flows. The third operation state may include, for example, a situation where the external charger is not connected to the electronic device, and when the display is deactivated, the electronic device 10 is in the folded state, or the electronic device 10 is idle. According to this embodiment, the processor 470 may use the second charging control circuit 460 to interrupt the path through which the discharging current of the second battery 420 flows when the electronic device 10 is in the power-off state.

According to one embodiment, an electronic device may include first and second batteries connected in parallel with each other; a first charging control circuit capable of limiting input or output currents of the first battery; and a second charging control circuit capable of limiting input or output currents of the second battery. A method for managing a battery using an electronic device may include: identifying an operation state of the electronic device; using the first charging control circuit to limit a charging current of the first battery to be in a first specified range, and using the second control circuit to limit a charging current of the second battery to be in a second charging specified range when the operation state is a first operation state; using the first charging control circuit to limit a discharging current of the first battery to be in a third specified range, and using the second control circuit to limit a discharging current of the second battery to be in a fourth specified range when the operation state is a second operation state; and using the second control circuit to interrupt flow of the discharging current of the second battery when the operation state is a third operation state.

The method for managing the battery may further include controlling the first charging control circuit to cease limiting the discharging current of the first battery.

Controlling the first charging control circuit to cease limiting the discharging current may occur after a specified time interval has lapsed from interrupting the flow of the discharging current using the second charging control circuit.

The specified time interval may be set to exceed a time required for transmitting, to the second charging control circuit, a command related to interrupting the flow of the discharging current, and for interrupting, by the second charging control circuit, the flow of the discharging current based on the command.

The limiting of the charging current of the first battery may include, in a situation where voltage of the first battery is above a first reference voltage, using the first charging control circuit to limit the charging current of the first battery when the operation state is the first operation state.

The limiting of the charging current of the second battery may include, in a situation where voltage of the second battery is above the first reference voltage, using the second charging control circuit to limit the charging current of the second battery when the operation state is the first operation state.

According to one embodiment, the first charging control circuit may include: a first path through which the charging current of the first battery flows; and a second path through which the discharging current of the first battery flows. The second charging control circuit may include: a third path through which the charging current of the second battery flows; and a fourth path through which the discharging current of the second battery flows. The method may further include: interrupting the first path and closing the second path, in the first operation state, when the voltage of the first battery is above a second reference voltage and when the charging current of the first battery is equal to or below a lower limit value of the first specified range; and interrupting the third path and closing the fourth path, in the first operation state, when the voltage of the second battery is above the second reference voltage and when the charging current of the second battery is equal to or below a lower limit value of the second specified range.

According to one embodiment, in a situation where the voltage of the first battery is equal to or below the first reference voltage, the first charging control circuit may provide a third path through which the charging current of the first battery flows. Further, in a situation where the voltage of the second battery is equal to or below the first reference voltage, the second charging control circuit may provide a sixth path through which the charging current of the second battery flows. The method for managing the battery may further include: interrupting the third path of the first charging control circuit when the voltage of the first battery is above the first reference voltage; and interrupting the sixth path of the second charging control circuit when the voltage of the second battery is above the first reference voltage.

Figure 12:
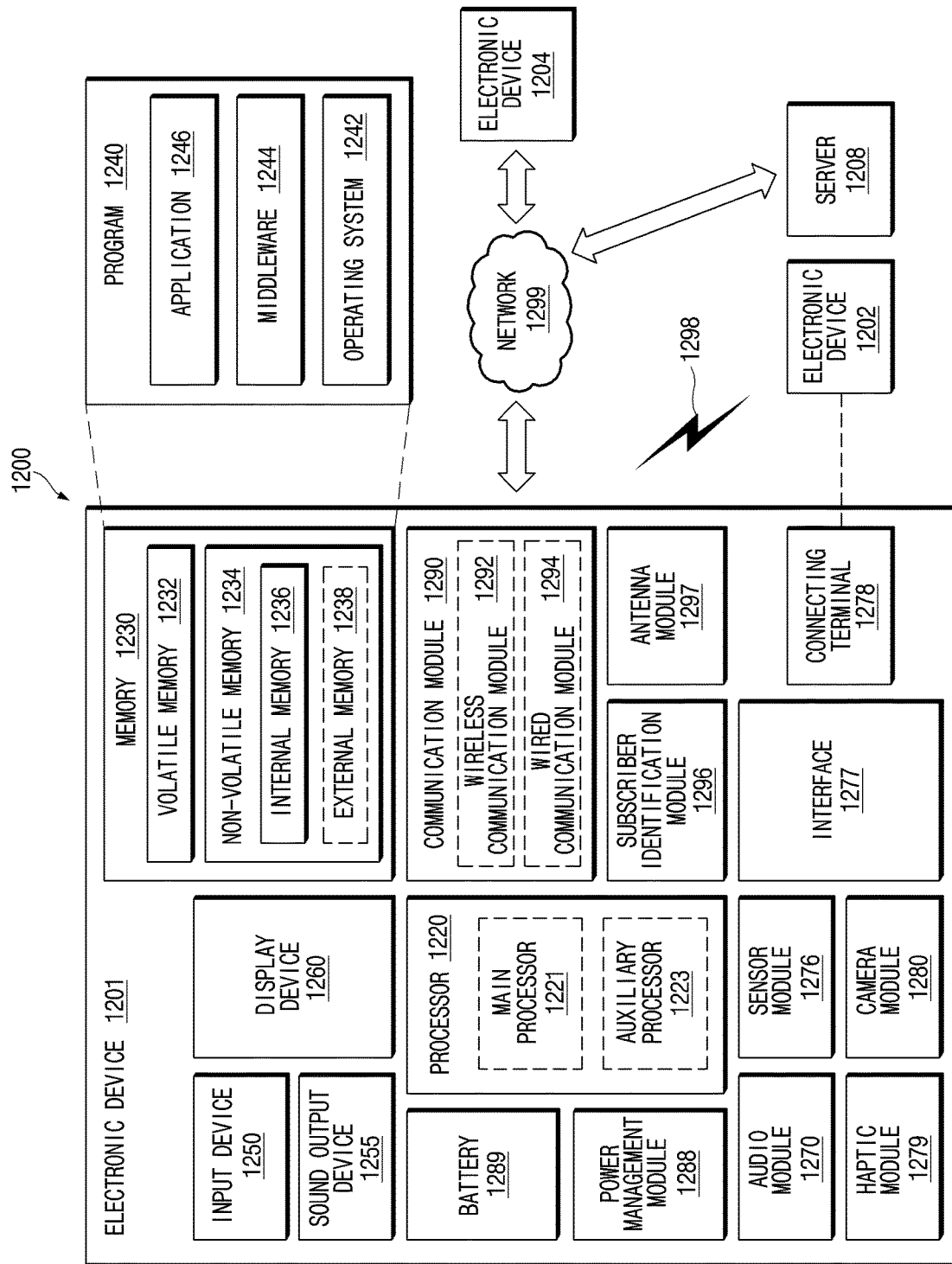
FIG. 12 is a block diagram illustrating an electronic device in a network environment according to one embodiment.

FIG. 12 is a block diagram illustrating an electronic device 1201 in a network environment 1200 according to one embodiment. Referring to FIG. 12, the electronic device 1201 in the network environment 1200 may communicate with an electronic device 1202 via a first network 1298 (e.g., a short-range wireless communication network), or an electronic device 1204 or a server 1208 via a second network 1299 (e.g., a long-range wireless communication network). According to an embodiment, the electronic device 1201 may communicate with the electronic device 1204 via the server 1208. According to an embodiment, the electronic device 1201 may include a processor 1220, memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module (SIM) 1296, or an antenna module 1297. In some embodiments, at least one (e.g., the display device 1260 or the camera module 1280) of the components may be omitted from the electronic device 1201, or one or more other components may be added in the electronic device 1201. In some embodiments, some of the components may be implemented as single integrated circuitry. For example, the sensor module 1276 (e.g., a fingerprint sensor, an iris sensor, or an illuminance sensor) may be implemented as embedded in the display device 1260 (e.g., a display).

The processor 1220 may execute, for example, software (e.g., a program 1240) to control at least one other component (e.g., a hardware or software component) of the electronic device 1201 coupled with the processor 1220, and may perform various data processing or computation. According to one embodiment, as at least part of the data processing or computation, the processor 1220 may load a command or data received from another component (e.g., the sensor module 1276 or the communication module 1290) in volatile memory 1232, process the command or the data stored in the volatile memory 1232, and store resulting data in non-volatile memory 1234. According to an embodiment, the processor 1220 may include a main processor 1221 (e.g., a central processing unit (CPU) or an application processor (AP)), and an auxiliary processor 1223 (e.g., a graphics processing unit (GPU), an image signal processor (ISP), a sensor hub processor, or a communication processor (CP)) that is operable independently from, or in conjunction with, the main processor 1221. Additionally or alternatively, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display device 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input device 1250 may receive a command or data to be used by other component (e.g., the processor 1220) of the electronic device 1201, from the outside (e.g., a user) of the electronic device 1201. The input device 1250 may include, for example, a microphone, a mouse, or a keyboard.

The sound output device 1255 may output sound signals to the outside of the electronic device 1201. The sound output device 1255 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1260 may visually provide information to the outside (e.g., a user) of the electronic device 1201. The display device 1260 may include, for example, a display, a hologram device, or a projector and control circuitry to control a corresponding one of the display, hologram device, and projector. According to an embodiment, the display device 1260 may include touch circuitry adapted to detect a touch, or sensor circuitry (e.g., a pressure sensor) adapted to measure the intensity of force incurred by the touch.

The audio module 1270 may convert a sound into an electrical signal and vice versa. According to an embodiment, the audio module 1270 may obtain the sound via the input device 1250, or output the sound via the sound output device 1255 or a headphone of an external electronic device (e.g., an electronic device 1202) directly (e.g., in a wired manner) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., in a wired manner) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, a SD card connector, or an audio connector (e.g., a headphone connector), The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to one embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or infrared data association (IrDA)) or the second network 1299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The antenna module 1297 may transmit or receive a signal or power to or from the outside (e.g., the external electronic device) of the electronic device 1201. According to an embodiment, the antenna module 1297 may include one or more antennas, and, therefrom, at least one antenna appropriate for a communication scheme used in the communication network, such as the first network 1298 or the second network 1299, may be selected, for example, by the communication module 1290 (e.g., the wireless communication module 1292). The signal or the power may then be transmitted or received between the communication module 1290 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 and 1204 may be a device of a same type as, or a different type, from the electronic device 1201. According to an embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., in a wired manner), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to embodiments disclosed herein, the charging/discharging of the plurality of batteries connected in parallel may be stably controlled. In addition, various other effects and/or advantages that are directly or indirectly understood through the disclosure may be provided.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
 a housing having a first housing structure and a second housing structure, wherein the first and second housing structures are foldable with respect to each other about a hinge axis;
 a processor disposed in the housing;
 a first battery disposed in the first housing structure;
 a second battery disposed in the second housing;
 a flexible printed circuit board (FPCB) extending from the first housing structure to the second housing structure and crossing the hinge axis;
 a power management integrated circuit (PMIC) disposed in the first housing structure and electrically connected to the processor and the FPCB;
 a first charging control circuit disposed in the first housing structure and electrically connected to the power management integrated circuit, the processor, the first battery, and the FPCB; and
 a second charging control circuit disposed in the second housing structure and electrically connected to the power management integrated circuit, the processor, the second battery, and the FPCB.

2. The electronic device of claim 1, wherein the first charging control circuit includes:
 a first charging path including a first switch and a first diode; and
 a second charging path including at least one transistor, wherein both the first and second paths are disposed between the power management integrated circuit and the first battery.

3. The electronic device of claim 2, wherein the first charging control circuit further includes:
 a first controller configured to use the at least one transistor to control charging current and/or discharging current of the first battery; and a second controller configured to:
when voltage of the first battery is equal to or below a specified voltage, turn on the first switch to allow current to flow through the first charging path; and
when the voltage of the first battery is above the specified voltage, turn off the first switch to interrupt the current flowing through the first charging path.

4. The electronic device of claim 1, wherein the second charging control circuit includes:
a third charging path including a second switch and a second diode; and
a fourth charging path including at least one transistor,
wherein both the third and fourth paths are disposed between the power management integrated circuit and the second battery.

5. The electronic device of claim 4, wherein the second charging control circuit further includes:
a third controller configured to use the at least one transistor to control charging current and/or discharging current of the second battery; and
a fourth controller configured to:
when voltage of the second battery is equal to or below a specified voltage, turn on the second switch to allow current to flow through the third charging path; and
when the voltage of the second battery is above the specified voltage, turn off the second switch to interrupt the current flowing through the third charging path.

6. A foldable electronic device comprising:
a first bracket;
a second bracket;
a hinge structure constructed to adjust an angle between the first bracket and the second bracket;
a first battery disposed on one side of the first bracket;
a second battery disposed on one side of the second bracket;
a connecting member including a portion disposed between the first bracket and the second bracket, wherein the connecting member is configured to connect the first battery and the second battery in parallel;
a first charging control circuit disposed on one side of the first bracket for limiting input or output current into or from the first battery;
a second charging control circuit disposed on one side of the second bracket for limiting input or output current into or from the second battery; and
a processor operatively connected to the first battery, the second battery, the first charging control circuit, and the second charging control circuit,
wherein the processor is configured to:
identify an operation state of the foldable electronic device;
when the operation state is a first operation state, control the first charging control circuit to limit a charging current of the first battery to be in a first specified range, and control the second charging control circuit to limit a charging current of the second battery to be in a second specified range;
when the operation state is a second operation state, control the first charging control circuit to limit a discharging current of the first battery to be in a third specified range, and control the second charging control circuit to limit a discharging current of the second battery to be in a fourth specified range; and
when the operation state is a third operation state, control the second charging control circuit to interrupt flow of the discharging current of the second battery.

7. The foldable electronic device of claim 6, wherein when the operation state is the third operation state, the processor is further configured to transmit a command to instruct the first charging control circuit to cease limiting the discharging current of the first battery.

8. The foldable electronic device of claim 7, wherein the processor is further configured to transmit the command after a specified time interval has lapsed from the flow of the discharging current of the second battery being interrupted by the second charging control circuit.

9. The foldable electronic device of claim 8, wherein the specified time interval exceeds a time required for transmitting the command and for the second charging control circuit to interrupt the flow of the discharging current of the second battery.

10. The foldable electronic device of claim 6, wherein the first operation state includes a state in which:
when an external charger is connected to the foldable electronic device;
each of voltages of the first battery and the second battery is above a first reference voltage;
charging current from the external charger is supplied to the first battery via the first charging control circuit; and
the charging current from the external charger is supplied to the second battery via the second charging control circuit.

11. The foldable electronic device of claim 6, further comprising:
a display,
wherein in the second operation state, the display is activated while an external charger is disconnected from the foldable electronic device.

12. The foldable electronic device of claim 6, further comprising a display,
wherein the third operation state is:
a state in which the display is deactivated when an external charger is disconnected from the foldable electronic device,
a folded state of the foldable electronic device in which an angle between the first bracket and the second bracket is minimized, and/or
an idle state of the foldable electronic device.

13. The foldable electronic device of claim 6, wherein the first charging control circuit includes:
a first path through which the charging current of the first battery flows; and
a second path through which the discharging current of the first battery flows,
wherein the second charging control circuit controls:
a third path through which the charging current of the second battery flows; and
a fourth path through which the discharging current of the second battery flows,
and wherein the processor is further configured to:
when the charging current of the first battery is equal to or below a lower limit value of the first specified range while the foldable electronic device is in the first operation state and a voltage of the first battery is above a second reference voltage, interrupt the first path and to close the second path,
when the charging current of the second battery is equal to or below a lower limit value of the second specified range while the foldable electronic device is in the first operation state and a voltage of the second battery is above the second reference voltage, interrupt the third path and to close the fourth path.

14. The foldable electronic device of claim 6,
wherein the first charging control circuit is configured to:
include a third path through which the charging current of the first battery flows when a voltage of the first battery is equal to or below a first reference voltage; and
interrupt the third path of the first charging control circuit when the voltage of the first battery is above the first reference voltage,
and wherein the second charging control circuit is configured to:
include a third path through which the charging current of the second battery flows when a voltage of the second battery is equal to or below the first reference voltage; and
interrupt the third path of the second charging control circuit when the voltage of the second battery is above the first reference voltage.

15. The foldable electronic device of claim 6, wherein the processor is further configured to:
receive state information of the first battery from the first charging control circuit and/or receive state information of the second battery from the second charging control circuit; and
change the first specified range, the second specified range, the third specified range, and/or the fourth specified range based on the state information.

16. The foldable electronic device of claim 15, wherein the state information of the first battery includes information regarding temperature, voltage, the charging current, and/or the discharging current of the first battery, and
wherein the state information of the second battery includes information regarding temperature, voltage, the charging current, and/or the discharging current of the second battery.

17. The foldable electronic device of claim 6, further comprising:
a display,
wherein the processor is further configured to:
receive state information of the first battery from the first charging control circuit and/or receive state information of the second battery from the second charging control circuit; and
output, on the display, at least a portion of the state information of the first battery and/or the state information of the second battery.

18. The foldable electronic device of claim 6, further comprising:
a power input of a system circuit configured to receive the discharging currents of the first battery and the second battery; and
a power management integrated circuit configured to control charging of the first and second batteries and to supply, to the power input, power from the first battery, the second battery, or an external charger connected to the foldable electronic device,
wherein the first battery and the second battery have the same capacity, and
wherein the first battery and the second battery have different impedances loaded on the power management integrated circuit due to a member including the connecting member for connecting the first battery and the second battery in parallel.

19. A method for managing one or more batteries by an electronic device, wherein the electronic device comprises:
first and second batteries connected in parallel with each other;
a first charging control circuit configured to limit input or output current into or from the first battery; and
a second charging control circuit configured to limit input or output current into or from the second battery,
wherein the method comprises:
identifying an operation state of the electronic device;
when the operation state is a first operation state, controlling the first charging control circuit to limit a charging current of the first battery to be in a first specified range, and controlling the second charging control circuit to limit a charging current of the second battery to be in a second specified range;
when the operation state is a second operation state, controlling the first charging control circuit to limit a discharging current of the first battery to be in a third specified range, and controlling the second charging control circuit to limit a discharging current of the second battery to be in a fourth specified range; and
when the operation state is a third operation state, controlling the second charging control circuit to interrupt flow of the discharging current of the second battery.

20. The method of claim 19, further comprising:
controlling the first charging control circuit to limit the discharging current of the first battery when the operation state is the third operation state.

* * * * *